United States Patent
Shikata et al.

(10) Patent No.: US 12,052,037 B2
(45) Date of Patent: Jul. 30, 2024

(54) ENHANCING EFFICIENCY OF EXCESS LOOP DELAY COMPENSATION IN DELTA-SIGMA ANALOG-TO-DIGITAL CONVERTERS

(71) Applicant: Analog Devices, Inc., Wilmington, MA (US)

(72) Inventors: Akira Shikata, Chelsea, MA (US); Abhishek Bandyopadhyay, Winchester, MA (US)

(73) Assignee: Analog Devices, Inc., Wilmington, MA (US)

( * ) Notice: Subject to any disclaimer, the term of this patent is extended or adjusted under 35 U.S.C. 154(b) by 178 days.

(21) Appl. No.: 17/702,515

(22) Filed: Mar. 23, 2022

(65) Prior Publication Data

US 2022/0216882 A1     Jul. 7, 2022

Related U.S. Application Data

(63) Continuation of application No. PCT/US2020/052359, filed on Sep. 24, 2020.
(Continued)

(51) Int. Cl.
*H03M 3/00*     (2006.01)

(52) U.S. Cl.
CPC ........... *H03M 3/322* (2013.01); *H03M 3/426* (2013.01)

(58) Field of Classification Search
CPC ........ H03M 3/37; H03M 3/424; H03M 3/464; H03M 1/12; H03M 3/454; H03M 3/458;
(Continued)

(56) References Cited

U.S. PATENT DOCUMENTS

| | | | |
|---|---|---|---|
| 7,535,392 B2 * | 5/2009 | Weng | H03M 3/37 341/118 |
| 7,948,412 B2 * | 5/2011 | Aiba | H03M 3/372 341/143 |

(Continued)

FOREIGN PATENT DOCUMENTS

| | | |
|---|---|---|
| CN | 114503437 A | 5/2022 |
| DE | 112020004516 T5 | 6/2022 |
| WO | WO-2021061885 A1 | 4/2021 |

OTHER PUBLICATIONS

Liu et al., *A 0.029-mm2 17-fJ/Conversion-Step Third-Order CT ΔΣ with a Single OTA and Second Order Noise-Shaping SAR Quantizer*, IEEE Journal of Solid-State Circuits, Feb. 1, 2019, pp. 428-440.
(Continued)

*Primary Examiner* — Linh V Nguyen
(74) *Attorney, Agent, or Firm* — Schwegman Lundberg & Woessner, P.A.

(57) ABSTRACT

Systems and methods are provided for increasing efficiency of excess loop delay compensation in delta-sigma analog-to-digital converters. In some examples, systems and methods are provided for reducing total capacitance in an embedded excess loop delay compensation digital-to-analog converter (DAC) in a quantizer for a continuous time delta-sigma ADC. In other examples, the excess loop delay compensation DAC can be a current domain DAC, a charge domain DAC, or a voltage domain DAC. Additionally, methods are provided for digitally controlling the gain of an excess loop delay DAC. Furthermore, methods are provided to calibrate a gain mismatch between a main successive approximation register DAC and an excess loop delay DAC. The systems and methods provided herein improve performance of continuous time delta-sigma ADCs. Continuous time delta-sigma ADCs are high precision and power effi- (Continued)

cient ADCs, often used in audio playback devices and medical devices.

18 Claims, 17 Drawing Sheets

Related U.S. Application Data

(60) Provisional application No. 62/905,348, filed on Sep. 24, 2019.

(58) Field of Classification Search
CPC .......... H03M 3/426; H03M 1/06; H03M 3/30; H03M 3/43; H03M 1/1245; H03M 1/466; H03M 1/468; H03M 1/804; H03M 1/001; H03M 3/438; H03M 1/0607; H03M 1/0665; H03M 1/10; H03M 1/0854; H03M 1/38; H03M 1/34; H03M 1/403; H03M 1/46; H03M 1/462; H03M 1/502; H03M 1/66
USPC .................. 341/118–120, 143, 155, 172
See application file for complete search history.

(56) References Cited

U.S. PATENT DOCUMENTS

| | | | | |
|---|---|---|---|---|
| 8,760,331 B2* | 6/2014 | Kaald | .................. | H03M 3/37 |
| | | | | 341/143 |
| 9,455,737 B1* | 9/2016 | Rajaee | .................. | H03M 3/464 |
| 9,948,318 B1* | 4/2018 | Tsai | .................. | H03M 3/458 |
| 2016/0065232 A1 | 3/2016 | Alladi et al. | | |
| 2016/0134300 A1* | 5/2016 | Wang | .................. | H03M 1/42 |
| | | | | 341/172 |
| 2016/0233872 A1* | 8/2016 | Wei | .................. | H03M 3/37 |
| 2016/0365870 A1* | 12/2016 | Huang | .................. | H03M 3/464 |
| 2016/0380646 A1* | 12/2016 | Kauffman | .................. | H03M 1/0607 |
| | | | | 341/118 |
| 2018/0219558 A1 | 8/2018 | Chiu et al. | | |
| 2019/0181880 A1* | 6/2019 | Huang | .................. | H03M 3/428 |
| 2019/0199368 A1* | 6/2019 | Weng | .................. | H03M 3/454 |

OTHER PUBLICATIONS

Wang et al., *A Mode-Configurable Analog Baseband for Wi-Fi 11ac Direct-Conversion Receiver Utilizing a Single Filtering ΔΣ ADC*, 2016 IEEE Radio Frequency Integrated Circuits Symposium, May 22, 2016, pp. 170-173.

"International Application Serial No. PCT/US2020/052359, International Preliminary Report on Patentabilty mailed Apr. 7, 2022", 14 pgs.

"International Application Serial No. PCT/US2020/052359, International Search Report mailed Mar. 10, 2021", 6 pgs.

"International Application Serial No. PCT/US2020/052359, Invitation to Pay Additional Fees mailed Jan. 12, 2021", 12 pgs.

"International Application Serial No. PCT/US2020/052359, Written Opinion mailed Mar. 10, 2021", 12 pgs.

* cited by examiner

520

522

4C 2C C 0.5C

528

| State | | reset | 4C | 2C | C | 0.5C | Total |
|---|---|---|---|---|---|---|---|
| 524 → | Example | 0.5 | 0.5 | 0.5 | 0.5 | 0.5 | 3.75 |
| 526a → ELD1 | Bits | | $C_{kb}[2]$ | $C_{kb}[1]$ | $C_{kb}[0]$ | R | |
| 526b → | Example | | 1 | 0 | 1 | 0.5 | 5.25 |
| 526c → ELD2 | Bits | | R | $C_{kb}[2]$ | $C_{kb}[1]$ | $C_{kb}[0]$ | |
| | Example | | 0.5 | 1 | 0 | 1 | 4.5 |

FIG. 5B

ENHANCING EFFICIENCY OF EXCESS LOOP DELAY COMPENSATION IN DELTA-SIGMA ANALOG-TO-DIGITAL CONVERTERS

CROSS REFERENCE TO RELATED APPLICATIONS

This application is related to and claims the benefit of priority under 35 U.S.C. § 119(e) to International Patent Application No. PCT/US2020/052359 entitled, "Enhancing Efficiency of Excess Loop Delay Compensation in Delta-Sigma Analog-to-Digital Converters" filed Sep. 24, 2020 and U.S. Provisional Patent Application No. 62/905,348 entitled, "Enhancing Efficiency of Excess Loop Delay Compensation in Sigma Delta Analog-to-Digital Converters" filed on Sep. 24, 2019, which are hereby incorporated by reference in their entirety.

FIELD OF THE DISCLOSURE

The present invention relates to analog-to-digital converters, and, more specifically, to sigma delta analog-to-digital converters.

BACKGROUND

Analog-to-digital converters convert analog signals to the digital domain by sampling the analog signal and quantizing the sampled analog signal to generate a digital signal. Delta-sigma ADCs (also known as sigma-delta ADCs) use high frequency delta-sigma modulation for encoding the analog input signal into a digital output signal. Oversampling is used to improve noise filtering. Delta-sigma ADCs typically include a digital filter to subsequently reduce the sampling rate and filter out noise. Since delta-sigma ADCs use oversampling to reduce noise. In general, delta-sigma ADCs have high resolution.

Since the circuit blocks in delta-sigma ADCs introduce a time delay, for example during quantizing, an excess loop delay is introduced. Excess loop delay can have a detrimental effect on delta-sigma ADC performance.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY

Systems and methods are provided for increasing efficiency of excess loop delay compensation in delta-sigma analog-to-digital converters (also known as sigma-delta ADCs). In some examples, systems and methods are provided for reducing total capacitance in an embedded excess loop delay compensation digital-to-analog converter (DAC) in a quantizer for a continuous time delta-sigma ADC. In other examples, the excess loop delay compensation DAC can be a current domain DAC, a charge domain DAC, or a voltage domain DAC. Additionally, methods are provided for digitally controlling the gain of an excess loop delay DAC. Furthermore, methods are provided to calibrate a gain mismatch between a main successive approximation register DAC and an excess loop delay DAC. The systems and methods provided herein improve performance of continuous time delta-sigma ADCs. Continuous time delta-sigma ADCs are high precision and power efficient ADCs, often used in audio playback devices and medical devices.

According to one aspect, a method for operation of a delta-sigma analog-to-digital converter includes sampling a first input analog signal to a first set of capacitors and a first excess loop delay (ELD) signal to a second set of capacitors, placing a second excess loop delay (ELD) signal on the second set of capacitors to generate a controlled gain ELD signal, subtracting the controlled gain ELD signal from the sampled first input analog signal to generate a delta signal, generating a reference level based on a SAR control signal, comparing the delta signal with the reference level to produce an updated SAR control signal, and generating a SAR output code based on the updated SAR control signal.

According to another aspect, a delta-sigma analog-to-digital converter includes a sampling switch connected to an input, a first DAC coupled to the sampling switch having a first set of capacitors configured to store a successive approximation register (SAR) capacitance, a second set of capacitors coupled to the first set of capacitors configured to store an excess loop delay (ELD) capacitance, a quantizer configured to receive an output from the first and second sets of capacitors, and at least one feedback line connecting a quantizer output with the first and second sets of capacitors, wherein the at least one feedback line includes an ELD feedback line to the second set of capacitors.

According to another aspect, a delta-sigma analog-to-digital converter, includes a sampling switch connected to an input; a first DAC coupled to the sampling switch having a first set of capacitors configured to store a first input signal (SAR) capacitance; a second set of capacitors coupled to the first set of capacitors configured to store an excess loop delay (ELD) signal; a third capacitor coupled to the sampling switch; wherein the sampling switch is closed during a sampling phase, connecting the input to the first DAC, and wherein, during the sampling phase, the input is sampled to at least one of: at least a portion of the first set of capacitors, and the third capacitor. In some implementations, at least one of the first set of capacitors, the second set of capacitors, and the third capacitors are configured to be calibrated and constructed at each clock cycle from an overall bank of capacitors.

The drawings show exemplary analog-to-digital circuits and configurations. Variations of these circuits, for example, changing the positions of, adding, or removing certain elements from the circuits are not beyond the scope of the present invention. The illustrated converters, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which:

FIGS. 5A-5C are diagrams showing capacitors and a table with proposed capacitor control signals during different phases of operation, according to various embodiments of the disclosure;

DETAILED DESCRIPTION

Systems and methods are provided for increasing efficiency of excess loop delay compensation in delta-sigma analog-to-digital converters. In particular, systems and methods are provided for reducing total capacitance in an embedded excess loop delay compensation digital-to-analog converter in a quantizer for a continuous time delta-sigma ADC. Additionally, methods are provided for digitally controlling the gain of an excess loop delay (ELD) DAC. Furthermore, methods are provided to calibrate a gain mismatch between a main successive approximation register (SAR) DAC and an excess loop delay DAC. The systems and methods provided herein improve performance of continuous time delta-sigma ADCs. Continuous time delta-sigma ADCs are high precision and power efficient ADCs, often used in audio playback devices and medical devices.

Excess Loop Delay (ELD) compensation is typically done with a current steering DAC. As disclosed herein, systems and methods are provided to move ELD compensation to a capacitive domain, fusing the ELD compensation with the SAR operation. The invention includes a switching a sampling technique that is embedded in the converter such that lower area and higher power efficiency is achieved. The gain control methods improve performance of continuous-time delta-sigma ADCs by reducing power consumption while maintaining stability. Continuous-time delta-sigma ADCs are high precision and power efficient ADCs, which are a key component in many signal processing circuits.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Figure 1:
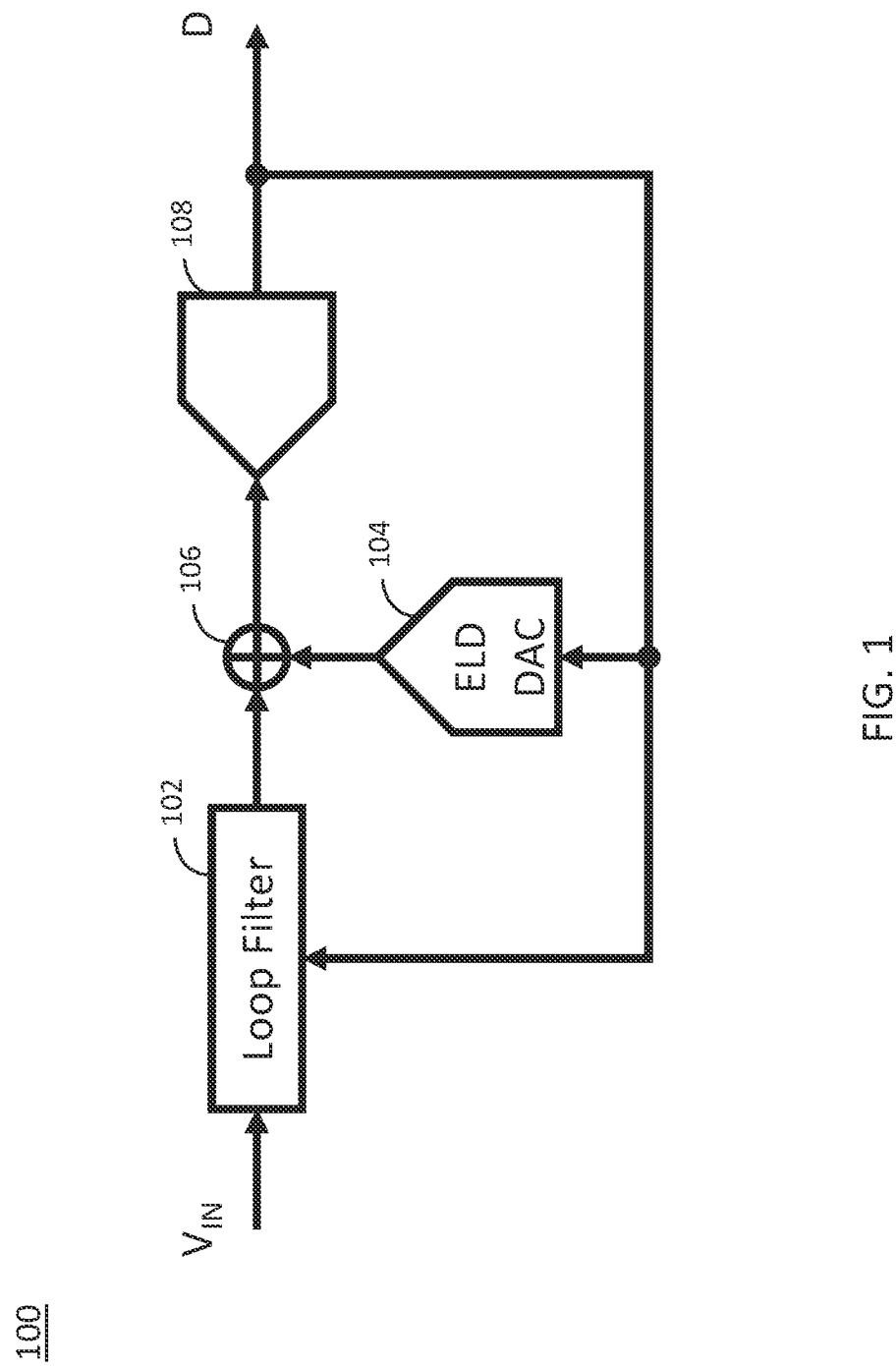
FIG. 1 depicts an analog-to-digital converter architecture.

FIG. 1 shows an analog-to-digital converter (ADC) 100 including a loop filter 102, a feedback excess loop delay (ELD) digital-to-analog converter (DAC) 104, a summer 106, and a quantizer 108. In some examples, the ADC 100 is a continuous time ADC. The quantizer can be a successive approximation register ADC, which has a conversion delay. Adding the ELD DAC serves to fix the conversion delay in the SAR quantizer. However, the ELD DAC consumes area on the chip and consumes power. Thus, it is desirable to embed the ELD DAC into the SAR ADC. Several methods and systems have been proposed for embedding the ELD DAC in the SAR ADC. However, previous systems have problems with increased gain in the feedback path. Some solutions include a second set of reference voltages for ELD DAC gain control, but the additional set of reference voltages require additional area and power for reference voltage generation.

Figure 2:
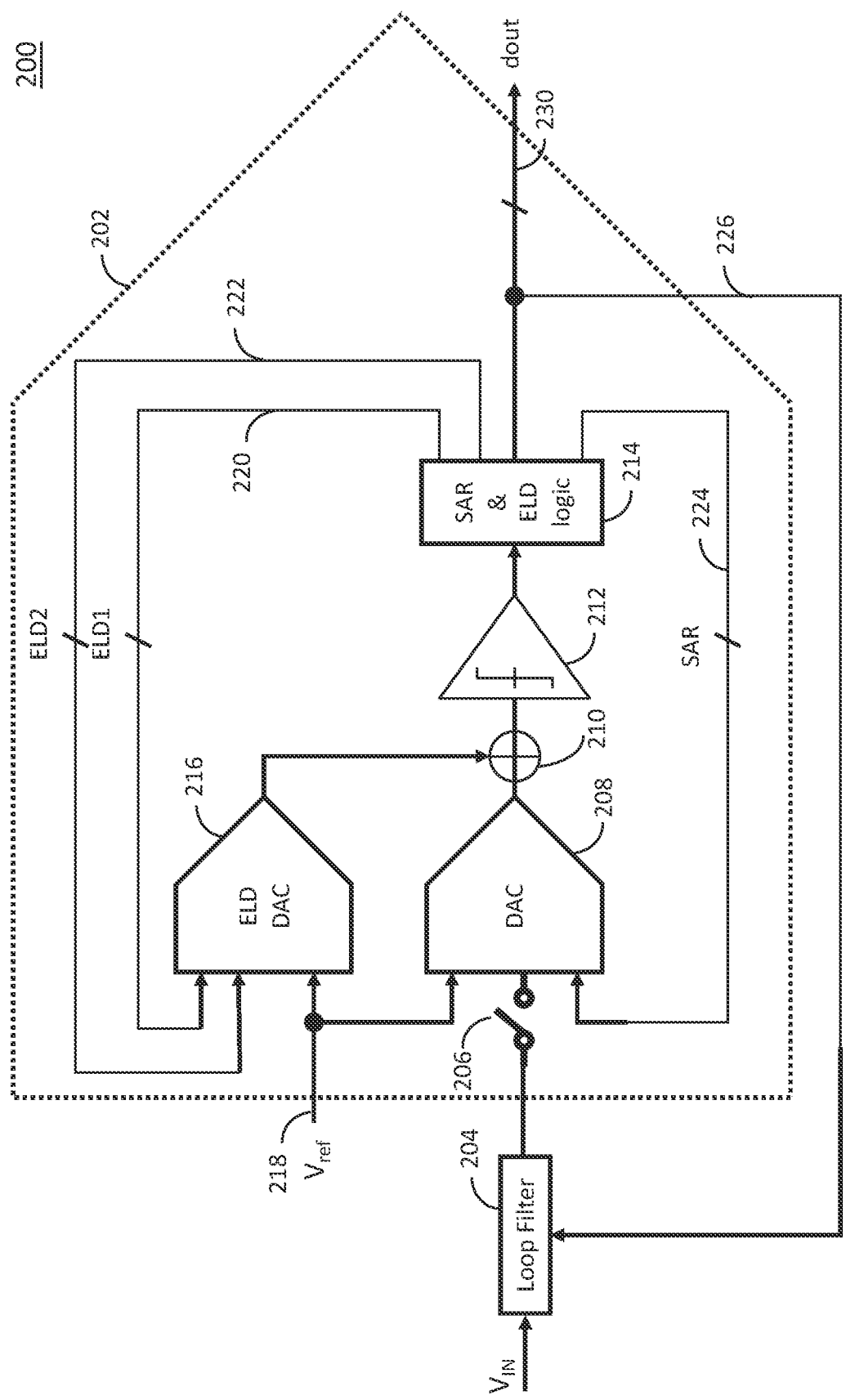
FIG. 2 is a diagram showing a delta-sigma analog-to-digital converter, according to various embodiments of the disclosure.

FIG. 2 is a diagram 200 showing a delta-sigma analog-to-digital converter, according to various embodiments of the disclosure. The SAR quantizer 202 is connected to a loop filter 204, and an output from the loop filter 204 is input to the SAR quantizer 202. The SAR quantizer 202 includes a switch 206 connected to the SAR quantizer 202 input, a first DAC 208, a summer 210, a comparator 212, successive approximation register and excess loop delay logic 214, an ELD DAC 216, and an output 230. An input to the loop filter 204 is a voltage input. The switch 206, when closed, connects the input (output from the loop filter 204) and the first DAC 208. According to various implementations, the switch 206 is closed during a sampling phase of the SAR quantizer 202 and the switch 206 is open during a conversion phase of the SAR quantizer 202. In some examples, the input is sampled onto additional sampling capacitors.

There is also a reference voltage 218 input to the first DAC 208, as well as a successive approximation register 214 feedback signal 224. The output from the first DAC 218 is input to the summer 210, where it is added to the output from the ELD DAC 216. In some implementations, the first DAC 208 and the ELD DAC 216 are combined or partially combined to reduce the overhead of ELD DAC 216 in the SAR quantizer 202. According to various implementations, the ELD feedback operation occurs during both the sampling phase and the conversion phases, allowing for increased ELD functionality. Additionally, in some examples, in the SAR quantizer 202, the ELD gain is programmable. In some examples, the ELD gain is controllable by changing the gain factors for ELD1 and ELD2. In some examples, in the SAR quantizer 202, the ELD gain is fixed.

The output from the summer 210 is input to the comparator 212. The comparison signal from the comparator 212 is input to the SAR and ELD logic module 214. The SAR and ELD logic module 214 outputs the delta-sigma ADC 200 output $d_{out}$ 230.

The SAR and ELD logic module 214 also outputs several feedback signals. First ELD signal ELD1 220 and second ELD signal ELD2 222 are output to the ELD DAC 216. ELD2 signal is to control the gain of ELD feedback operation. In some implementations, ELD2 is an inverted ELD1 signal. In some implementations, ELD2 is a bit-shifted ELD1 signal. In some implementations ELD1 and ELD2 can have different values. In some examples, the first ELD signal ELD1 220 and the second ELD signal ELD22 share a single feedback bus. Additionally, the SAR and ELD logic module 214 outputs a SAR feedback signal 224 to the first DAC 208. The output 226 from the SAR and ELD logic module 214 is also fed back to the loop filter 204. According to various implementations, the delta-sigma ADC 200 includes a modified switching scheme allowing the ELD functionality to be embedded within the SAR quantizer 202, thereby decreasing power usage of the ADC 200 and the area of the ADC 200 compared to previous systems.

Figure 3:
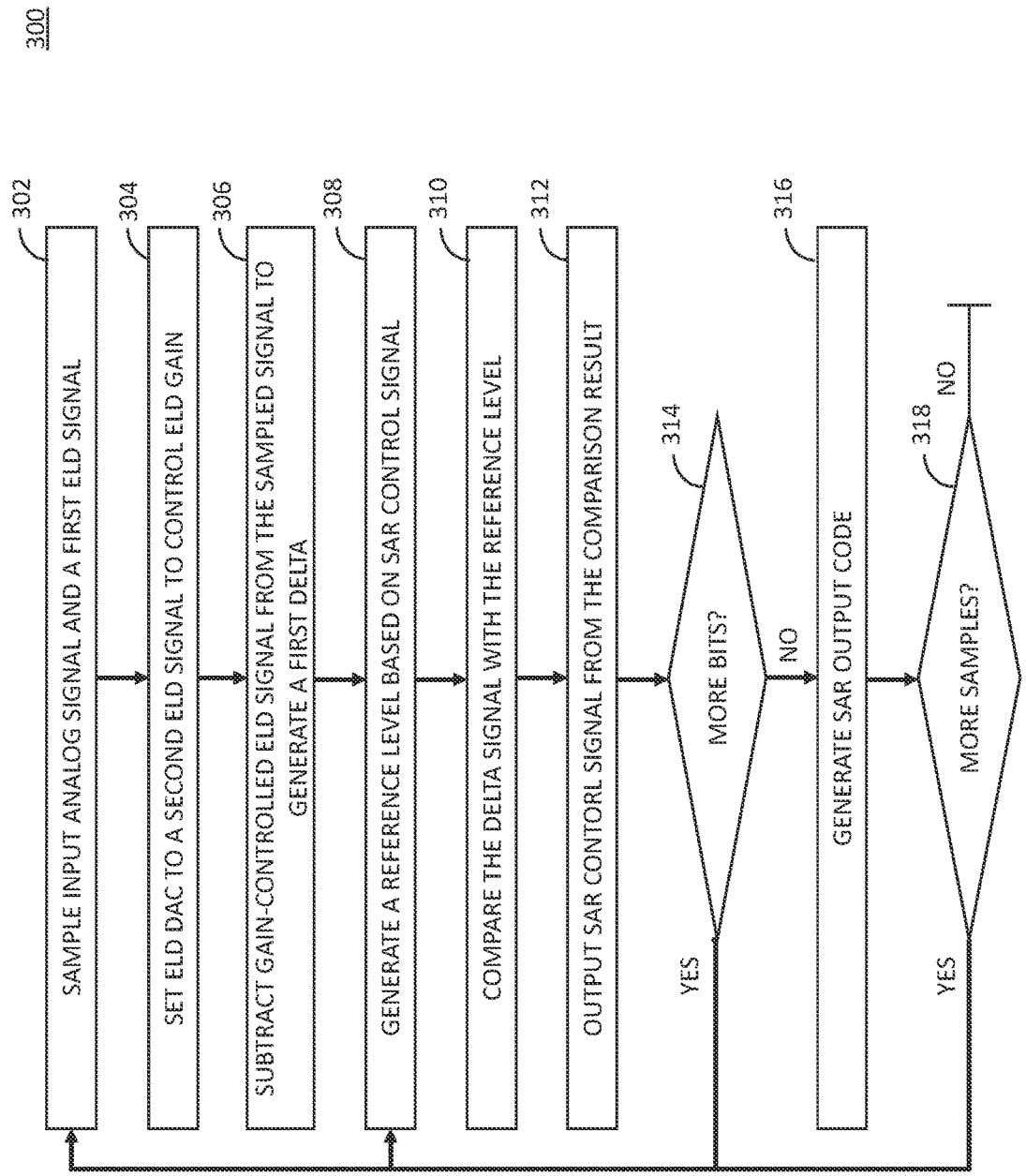
FIG. 3 is a flow chart showing a method for operation of a delta-sigma ADC, according to various embodiments of the disclosure.

FIG. 3 is a flow chart showing a method 300 for operation of a delta-sigma ADC, according to various embodiments of the disclosure. The method starts at step 302, when a first input analog signal is sampled to $C_{samp}$ and a first excess loop delay signal is sampled to $C_{ELD}$, to generate a first delta. According to various examples, $C_{samp}$ is the sum of capacitance used in sampling the input signal, and $C_{ELD}$ is the sum of ELD DAC capacitance. In some examples the input analog signal is sampled using additional capacitors. In some examples the input analog signal is sampled using a portion of the first or the second set of capacitors or the additional sampling capacitors. At step 304, the ELD DAC is set to a second ELD signal to control the overall ELD signal gain. At step 306, a gain controlled ELD signal is subtracted from the sampled signal to generate the first delta signal. In some examples, the second ELD signal is an ELD feedback signal. In one example, the second ELD signal is the feedback signal ELD2 on the second feedback line 222 in the SAR quantizer 202 of FIG. 2.

At step 308, a reference level is generated based on an SAR control signal. In some implementations, the reference level is generated at the main DAC, such as the first DAC 208 in the SAR quantizer 202 of FIG. 2. In some examples, the SAR control signal is an SAR feedback signal. In one example, the SAR control signal is the feedback signal SAR on the SAR feedback line 224 in the SAR quantizer 202 of FIG. 2, and the feedback signal SAR is converted at the first DAC 208.

At step 310, the delta signal generated at step 306 is compared with the reference level (generated at step 308). At step 312, the SAR control signal is updated based on the comparison result at step 310. At step 314, the method 300 determines whether there are more bits. If there are more bits, the method returns to step 308. When there are no more bits, the method proceeds to step 316. In some examples, the method 300 includes multiple conversion cycles (steps 308-314). In one example, the method 300 includes six conversion cycles. When the conversion cycles are complete, the method 300 proceeds to step 316, and a SAR output code is generated. At step 318, it is determined whether there are more samples. If there are more samples, the method 300 repeats, returning to step 302. If there are no more samples at step 318, the method 300 ends.

Figure 4A:
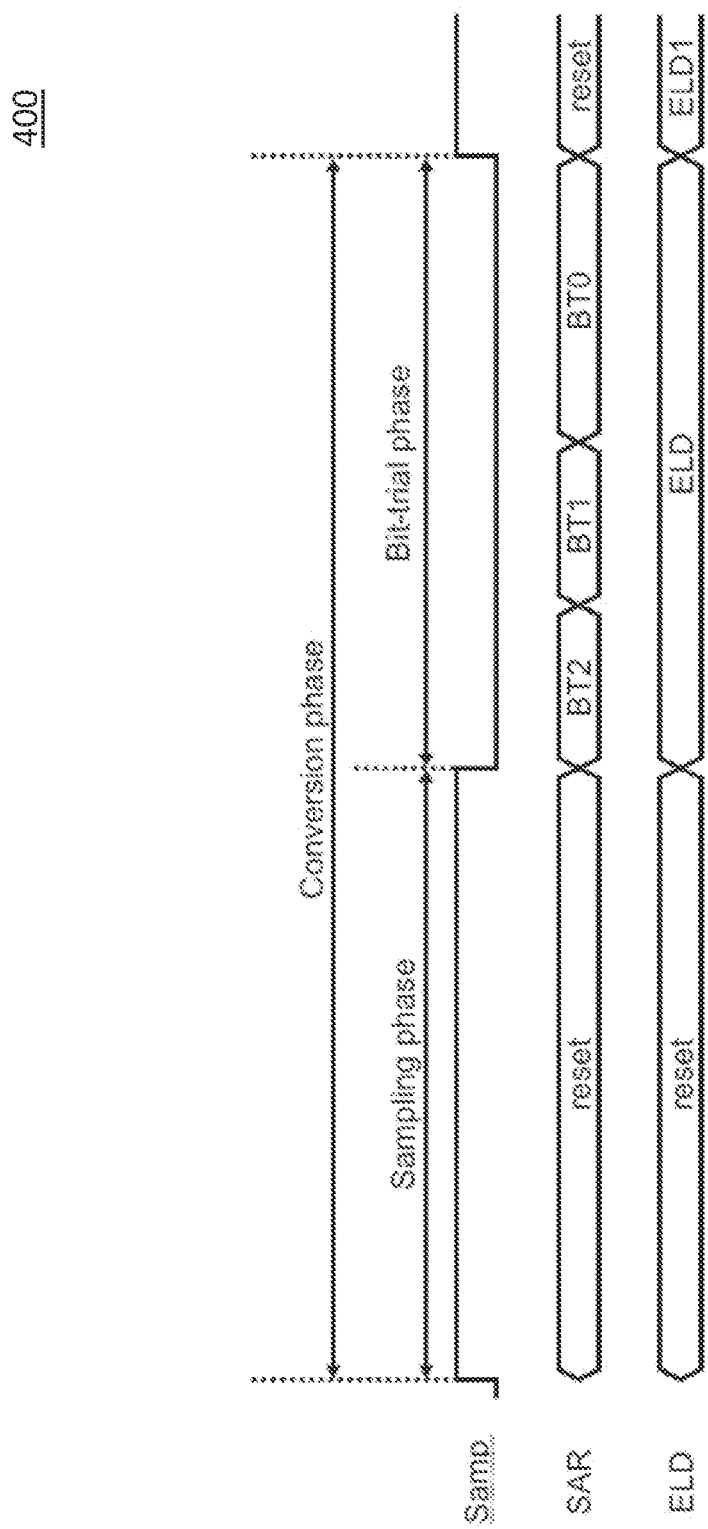
FIGS. 4A-4C show timing diagrams for delta-sigma analog-to-digital converters, according to various embodiments of the disclosure.
Figure 4B:
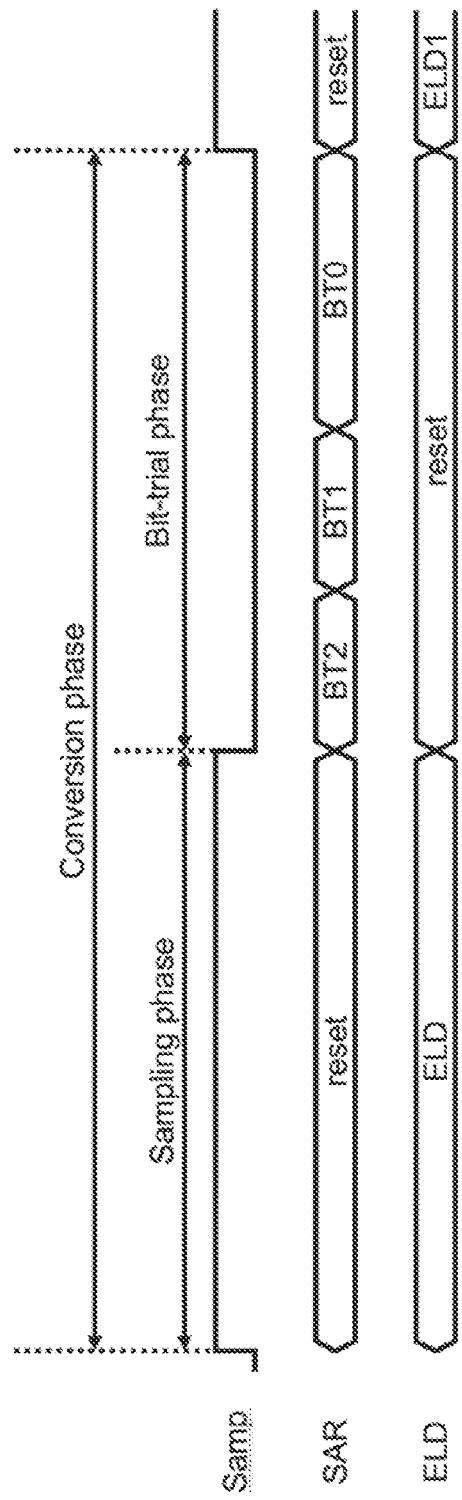
Figure 4C:
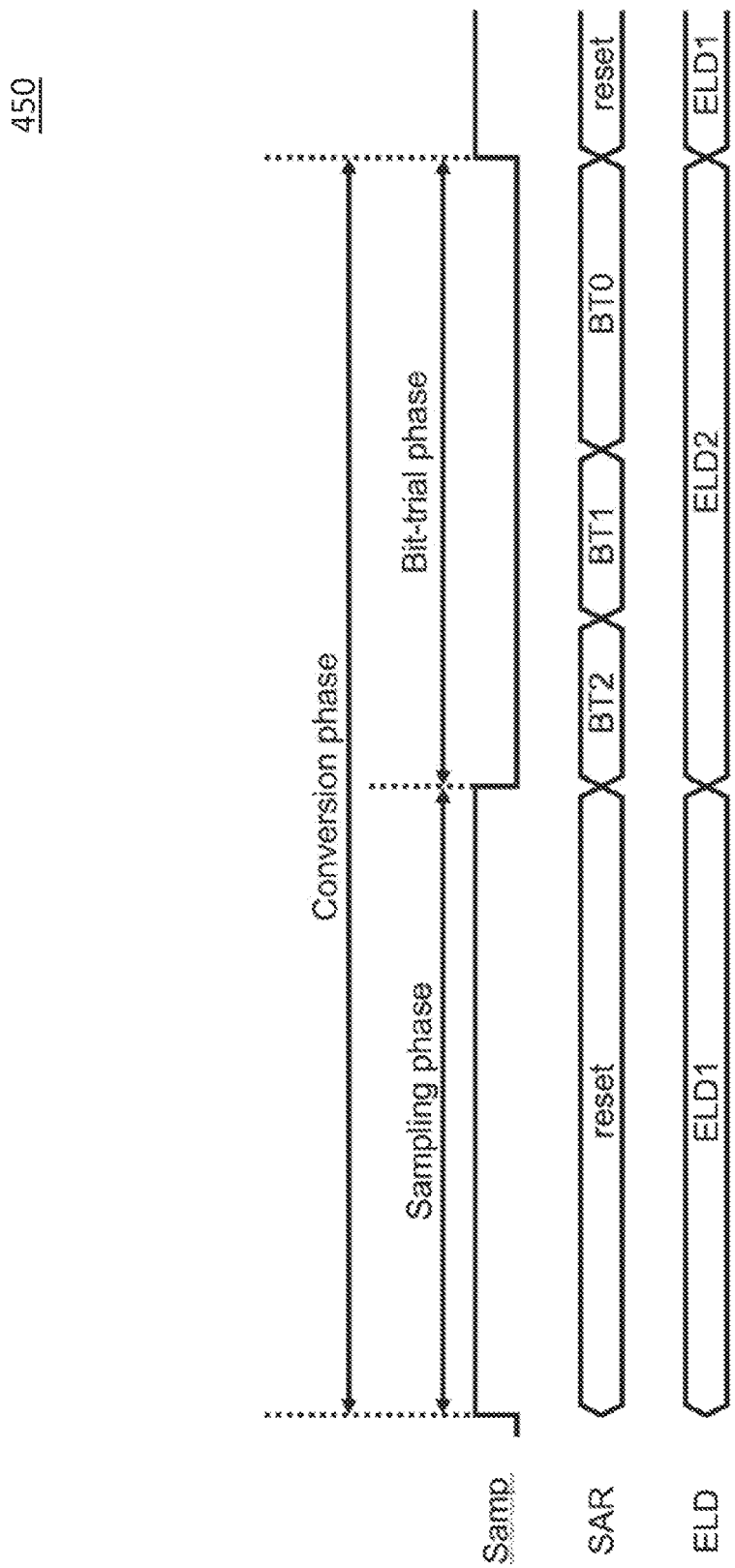

FIGS. 4A-4C show a timing diagrams for SAR quantizers, according to various embodiments of the disclosure. FIG. 4A shows a timing diagram 400 for a SAR quantizer including a sampling phase and a bit-trial phase, which together make up a conversion phase. During the sampling phase, the SAR and ELD DACs are both reset while the signal is sampled. In the bit-trial phase, the ELD DAC is set to the ELD2 signal and the SAR DAC starts a bit-trial operation. The timing diagram 400 shows a 3 bit operation, and thus there are three bit-trials (BT0, BT1, BT2) for the SAR. The ELD gain ($G_{ELD}$) in the example shown in FIG. 4A is equal to the capacitance scaling factor of ELD and SAR which is calculated by the sum of the ELD capacitance ($C_{ELD}$) divided by the sum of the SAR capacitance ($C_{SAR}$) ($G_{ELD}=C_{ELD}/C_{SAR}$).

FIG. 4B shows a timing diagram 420 for a SAR quantizer, again including a sampling phase and a bit-trial phase, which together make up a conversion phase. In the timing diagram 420, the ELD DAC is set to the ELD signal during the sampling phase and the ELD is reset during the bit-trial phase. In particular, in the timing diagram 420, the ELD is subtracted from the sample. The ELD gain ($G_{ELD}$) in the example shown in FIG. 4B is equal to the sum of the ELD capacitance ($C_{ELD}$) divided by the sum of the SAR capacitance ($C_{SAR}$) ($G_{ELD}=C_{ELD}/C_{SAR}$).

FIG. 4C shows a timing diagram 450 for a SAR quantizer, according to various embodiments of the disclosure, again including a sampling phase and a bit-trial phase, which together make up a conversion phase. In the timing diagram 450, the ELD DAC is not reset. In particular, the ELD DAC is set to a first ELD signal value ELD1 during the sampling phase and the ELD DAC is set to a second ELD signal value ELD2 during the bit-trial phase. This allows the use of the DAC to be maximized, saving on area and power. Additionally, using the method of the timing diagram 450 allows for gains higher than one—in particular, gains of 2 can be achieved. The ELD gain ($G_{ELD}$) in the example shown in FIG. 4C is equal to the difference between the amount of the first ELD signal ELD1 in the sampling phase ($\alpha_{ELD1}$) and the amount of the second ELD signal ELD2 in the bit trial phase ($\alpha_{ELD2}$) normalized by $\alpha_{ELD1}$ and multiplied by the sum of the ELD capacitance ($C_{ELD}$) divided by the sum of the SAR capacitance ($C_{SAR}$) ($G_{ELD}=(\alpha_{ELD1}-\alpha_{ELD2})/\alpha_{ELD1}*C_{ELD}/C_{SAR}$). A system using the timing diagram 450 can have a factor of two for gain.

In some examples, there are two sets of capacitors: a first set of capacitors for the SAR main feedback DAC and a second set of capacitors for the ELD feedback. The second set of capacitors for the ELD feedback is alternately used for the ELD1 feedback value (on the feedback line 220 of FIG. 2) and for the ELD2 feedback value (on the feedback line 222 of FIG. 2). The amount of capacitive difference between the ELD feedback and the main SAR DAC is a factor of gain. According to various features, the capacitance ratio is combined with the signal gain difference to increase efficiency of the system.

In conventional systems, the gain of an ELD DAC is set by the capacitance ratio with SAR main DAC. In one example, both the SAR main DAC and the ELD DAC are 3 bit DACs, the sum of the SAR main DAC capacitance is 7 C (4 C+2 C+C), and the sum of the ELD DAC capacitance is 14 C (8 C+4 C+2 C). In this example, the gain of the ELD equals 14 C divided by 7 C, which equals 2. In other systems, the gain of the ELD DAC is set by changing the reference voltage between the SAR main DAC and the ELD DAC. In one example, both the SAR main DAC and the ELD DAC are 3 bit DACs, the sum of the SAR main DAC capacitance is 7 C (4 C+2 C+1 C), and the sum of the ELD DAC capacitance is also 7 C (4 C+2 C+1 C). In this example, the ELD reference voltage is twice the SAR reference voltage. Thus, the gain of the ELD equals 2 times Vref divided by Vref, which equals 2.

Systems and methods described herein use both the sampling phase and bit trial phase of a SAR ADC to subtract or add for ELD feedback gain control. In contrast, conventional methods only use one of the phases (the sampling phase or the bit trial phase) for ELD feedback, and reset the signal applied to the ELD in the other phase. The systems and methods described have several advantages. According to some implementations, the systems and methods increase the efficiency of capacitor usage. According to some implementations, the systems and methods control the gain digitally instead of changing analog values (such as capacitance ratio or reference voltage), which saves circuit overhead and power. In one example, the SAR main DAC and the ELD DAC are 3 bit DACs, and a sum of SAR DAC and ELD DAC capacitances and reference voltages are the same. In this example, applying an ELD feedback signal to the ELD DAC (e.g., '010') in the sampling phase and applying an inverted ELD feedback signal (e.g., '101') to the ELD DAC in the bit-trial phase. With the reset value of 3.5 in decimal (the middle point of '111' and '000'), the amount of ELD1 and ELD2 signal are −1.5 ($\alpha_{ELD1}$=2−3.5=−1.5) and 1.5 ($\alpha_{ELD2}$=5−3.5=1.5), respectively. This results in a gain of ELD equal to two ($G_{ELD}$=($\alpha_{ELD1}$−$\alpha_{ELD2}$)/$\alpha_{ELD1}$*$C_{ELD}$/$C_{SAR}$=(−1.5−1.5)/(−1.5)*7 C/7 C=2).

According to other aspects, systems and methods described herein allow the ELD gain to be controlled digitally. In one example, the SAR main DAC is 7 C (4 C+2 C+C) total with 3 bits, and the ELD DAC is 7.5 C (4 C+2 C+C+0.5 C) total with 4 bits (i.e. 3 bits+a sub-bit). Even though the sub-bit increases the total capacitance of the ELD DAC, the sub-bit shifts the reset value from 3.5 (=7/2) to 3.75 (=7.5/2), and the ELD DAC still uses 3 bits (the first 3 bits (7 C in total) or the last 3 bits (3.5 C in total but bit shift includes 0.5× factor) for each ELD signal. This results in an effective total ELD capacitance $C_{ELD}$ remaining at 7 C and the capacitance scaling factor 1 (=7 C/7 C). A combination of subtraction and addition is used to provide additional gain settings. For example, applying an ELD feedback signal to the ELD DAC (assume '010R', $\alpha_{ELD1}$=2.25−3.75=−1.5) in the sampling phase and then applying a bit-shifted ELD feedback signal ('R010', $\alpha_{ELD2}$=3−3.75=−0.75) to the ELD DAC in the bit trial phase. In this example, the gain of the ELD equals 0.5 ($G_{ELD}$=(−1.5−(−0.75))/(−1.5)*1=0.5). In particular, R is used to express 0.5 (half of 1) for the simplicity in single-end fashion for the bit-shift operation. Similarly, if the inverted bit-shifted ELD feedback signal ('R101', $\alpha_{ELD2}$=0.75) is applied in bit-trial phase, the gain of ELD equals 1.5 ($G_{ELD}$=(−1.5−0.75)/(−1.5)*1=1.5).

According to some aspects, the ELD gain can be changed cycle-to-cycle. A coefficient in the loop filter of a continuous time delta-sigma ADC can change over process-voltage-temperature (PVT) variations. In some implementations, to keep the loop stable, the ELD gain tracks these changes over cycles. Using digital gain control for the ELD as described herein, any loop filter changes can be easily followed by the ELD gain. In some examples, the gain is tuned by external reference voltages, and it takes some time for the reference voltage to settle.

According to some aspects, systems and methods are provided for gain calibration between the ELD gain and the SAR gain. Since actual capacitance on a capacitor can vary (due, e.g., to mismatch), gains may be out of a target range. Gain calibration can be used to minimize a mismatch in a total SAR capacitance and a total ELD capacitance.

Figure 5A:
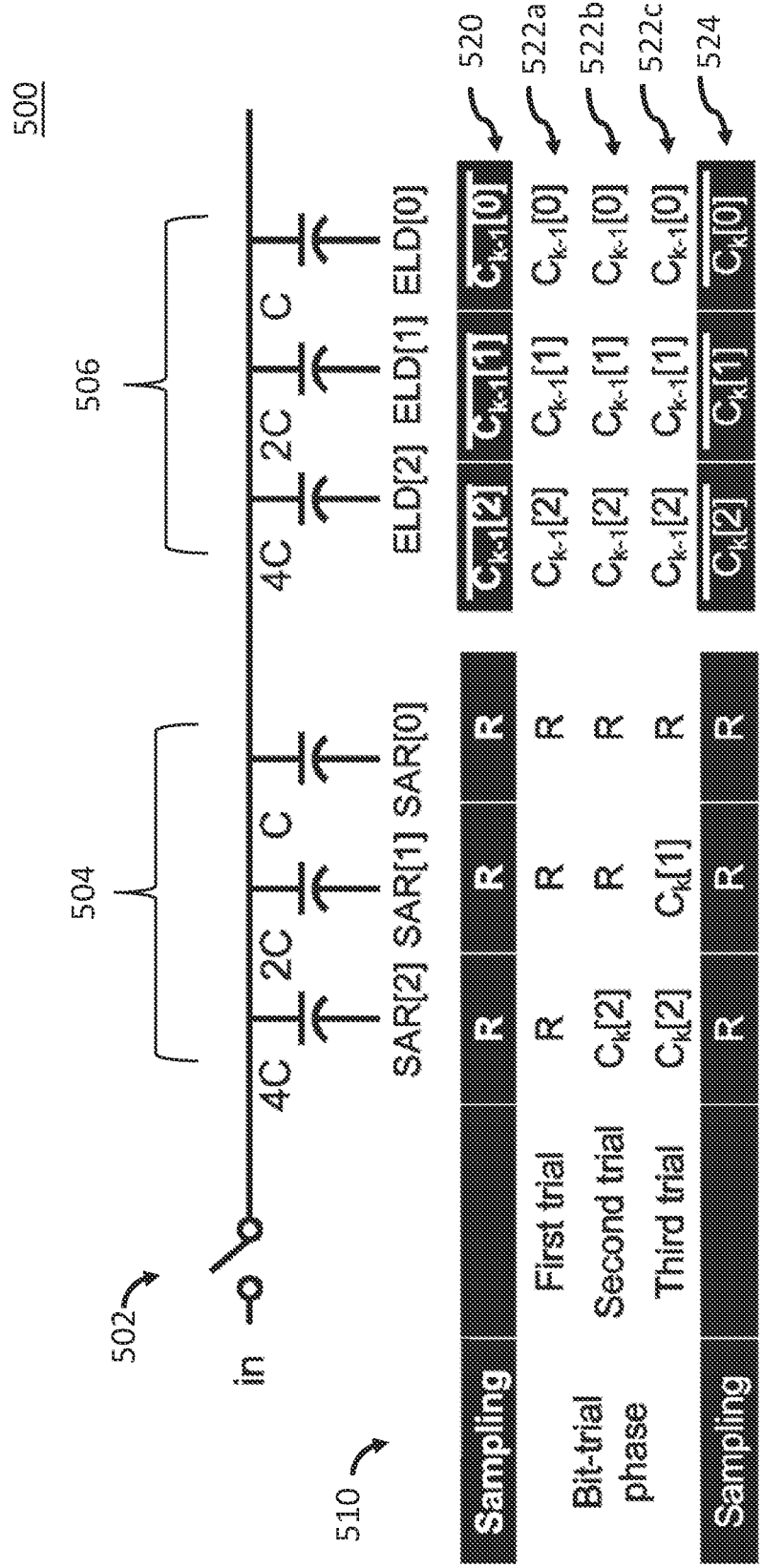

FIG. 5A is a diagram 500 showing SAR capacitors 504 and ELD capacitors 506 and a table 510 with proposed capacitor values, according to various embodiments of the disclosure. As shown in the diagram 500, the circuit includes a switch 502 at an input, followed by a first SAR capacitor having a SAR signal SAR[2], a second SAR capacitor having a SAR signal SAR[1], and a third SAR capacitor having a SAR signal SAR[0], and a first ELD capacitor having an ELD signal ELD[2], a second ELD capacitor having an ELD signal ELD[1], and a third ELD capacitor having an ELD signal ELD[0].

As shown in the diagram 500, the first SAR capacitor has a capacitance value of 4 C, the second SAR capacitor has a capacitance value of 2 C, and the third SAR capacitor has a capacitance value of C. Similarly, the first ELD capacitor has a capacitance value of 4 C, the second ELD capacitor has a capacitance value of 2 C, and the third ELD capacitor has a capacitance value of C. Thus, the total capacitance of the system is 14 C, which is 33% lower than previous systems. The lower capacitance allows for the use of smaller capacitors, saving space and decreasing power usage. The total capacitance of the system is lower, in part, because the ELD capacitors are used in both the sampling and bit-trial phases. In particular, previous systems required higher capacitance values for the ELD capacitors (8 C, 4 C, 2 C), in part because the ELD capacitors are not used in both sampling and bit-trial phases in previous systems. Using the ELD capacitors 506 during both the sampling and bit-trial phases allows for a reduction in the capacitance of the ELD capacitors 506, as descried in great detail below.

As shown in FIG. 5A, during a sampling phase 520, 524, the bottom plate of each of the SAR capacitors 504 is reset. According to various examples, the sampling switch 502 is closed during the sampling phase and open during the bit-trial phase. During the sampling phases 520, 524 shown in FIG. 5A, the input signal is charged to all the capacitors 504, 506. In particular, during the sampling phase, the top plate of each of the capacitors samples the input signal. According to various examples, the top plate is used for DAC output, while feedback is applied to the bottom plate of the capacitors. Furthermore, during the sampling phase, the ELD capacitors 506 are charged using an ELD signal. In one example, during the sampling phase, the ELD capacitors 506 are charged using the first ELD signal ELD1 on the first ELD feedback line 220 shown in FIG. 2.

During the bit-trial phase in FIG. 5A, there are three bit-trials 522a, 522b, 522c. In various examples, each bit-trial phase 522a, 522b, 522c corresponds to steps 308-314 of the method 300 described above with respect to FIG. 3. In the first bit-trial, all the SAR capacitors SAR[2:0] remain reset to generate a first reference level for comparison to obtain a first comparison result $C_k$[2]. In the second bit-trial, the capacitance of a first SAR capacitor SAR[2] is set, to the first comparison result $C_k$[2] to generate a second reference level. In the second bit-trial, an SAR feedback signal from the first bit-trial is incorporated into the result. In the third bit-trial, the capacitance of a second SAR capacitor SAR[1] is set to the second comparison result $C_k$[1]. The capacitance of the ELD capacitors 506 are all set to the second ELD signal ELD2 which is the previous SAR quantizer digital output (bit trial phase k−1). During the second sampling phase 524, the capacitance of the ELD capacitors 506 is set to the inverted comparison results obtained at the first 522a, second 522b, and third bit trial 522c. Additionally, during the second sampling phase 524, the bottom plates of the SAR capacitors 504 are reset.

FIG. 5B is a diagram 520 showing a set of ELD capacitors 522 along with a table 524 showing the capacitance value for each capacitor 522 during three different states: a reset state 526a (used in previous systems), an ELD1 state 526b (during the sampling phase, as shown in FIG. 4C), and an ELD2 state 526c (during the bit-trial phase, as shown in FIG. 4C). FIG. 5B shows an example for setting the gain at 0.5 instead of a gain of 2 for FIG. 5A. As shown in FIG. 5B, an additional 0.5 C capacitors are added to the set of ELD capacitors 522, as compared to the set of ELD capacitors 506 of FIG. 5A. According to various examples, the additional 0.5 C capacitor add flexibility to the gain. As shown in the last column of the table 524, in some examples, the total capacitance for the set of ELD capacitors 522 varies from 7 C to 7.5 C. In particular, during a reset state, each capacitors from the set of ELD capacitors 522 is set to 0.5, resulting in a total value of 3.75 and the amount of ELD signal $\alpha_{ELD}$, which is total value minus reset value, of 0 (3.75−3.75).

In the ELD1 state 526b, the capacitance of the first three capacitors is set as shown in FIG. 4A, and the additional 0.5 C capacitors is set to 0.5. In the example shown in FIG. 5B, these values total a 5.25 and the amount of signal $\alpha_{ELD1}$ is 1.5, as shown in table column 528. In the ELD2 state 526c, the ELD signal is shifted to the right to control gain by 1 bit and the first capacitor (the 4 C capacitor) is set to 0.5 (thus a value of 2 (4×0.5)). This results in a total value of 4.5 as shown in the total column 528 of the table 524. In various implementations, the second ELD feedback signal ELD2 is modified to accomplish the change in ELD2 shown in FIG. 5B. Adding the additional 0.5 C capacitor adds the flexibility to change the gain setting for the ELD capacitors, while having a minimal impact on the total area.

The gain can be represented with the following equation:

$$G_{ELD} = (a_{ELD1} - a_{ELD2})/a_{ELD1} = (a_{ELD1} - 0.5a_{ELD1})/a_{ELD1} = 0.5a_{ELD1}/a_{ELD1} = 0.5$$

where $G_{ELD}$ is the ELD gain, $\alpha_{ELD1}$ is the amount of the ELD control signal in the sampling phase (ELD1), and $\alpha_{ELD2}$ is the amount of the ELD control signal in the bit trial phase (ELD2).

Figure 5C:
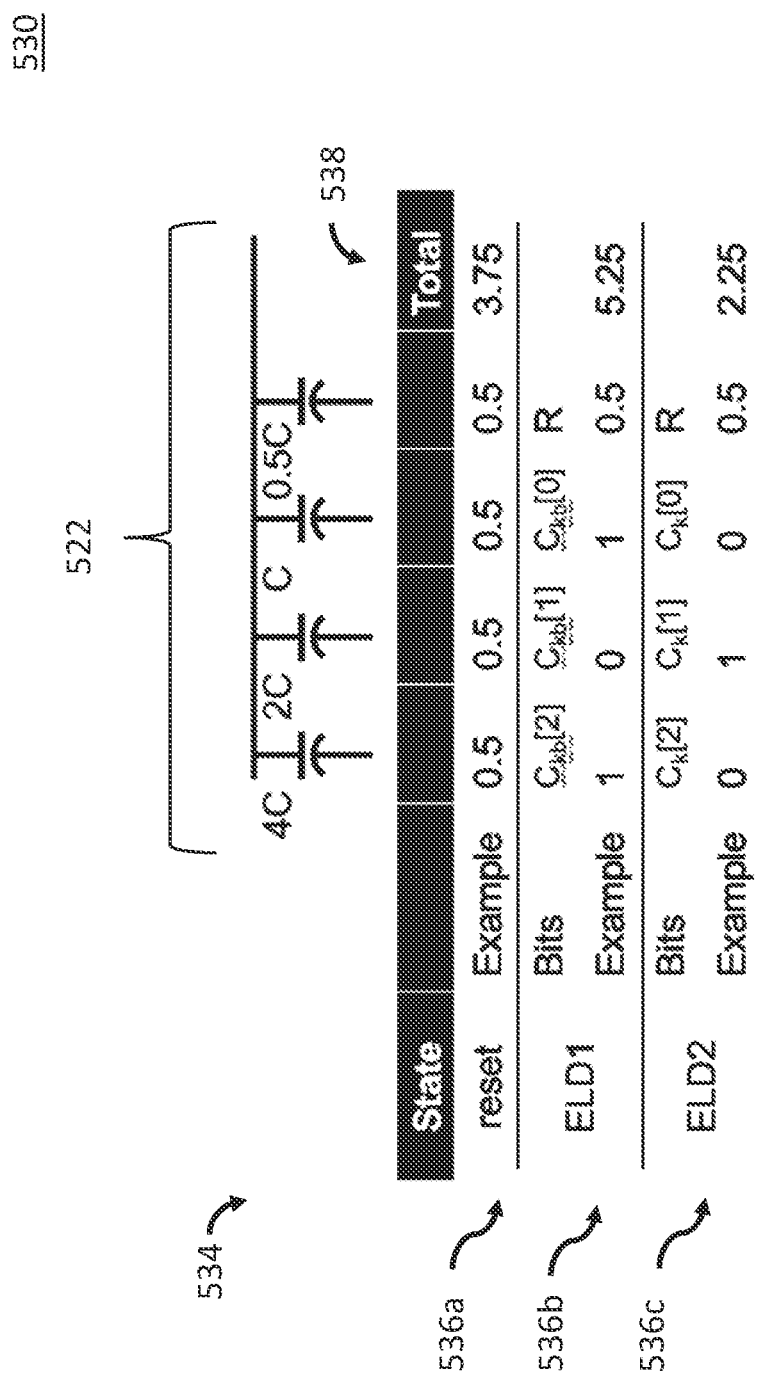

FIG. 5C is a diagram 530 showing the set of ELD capacitors 522 along with a table 534 showing the capacitance value for each capacitor 522 during three different states: a reset state 536a, an ELD1 state 536b (during the sampling phase, as shown in FIG. 4C), and an ELD2 state 536c (during the bit-trial phase, as shown in FIG. 4C). According to various examples, $C_{kb}$ equals an inverted value of $C_k$. FIG. 5C shows an example for using the extra 0.5 C capacitors to set the gain at 2. As shown in the last column of the table 534, in some examples, the total value for the set of ELD capacitors 522 varies from 5.25 to 2.25.

The gain can be represented with the following equation:

$$G_{ELD} = (a_{ELD1} - a_{ELD2})/a_{ELD1} = (a_{ELD1} - (-a_{ELD1}))/a_{ELD1} = 2a_{ELD1}/a_{ELD1} = 2$$

where $G_{ELD}$ is the ELD gain, $\alpha_{ELD1}$ is the amount of the ELD control signal in the sampling phase (ELD1), and $\alpha_{ELD2}$ is the amount of the ELD control signal in the bit trial phase (ELD2).

Figure 6:
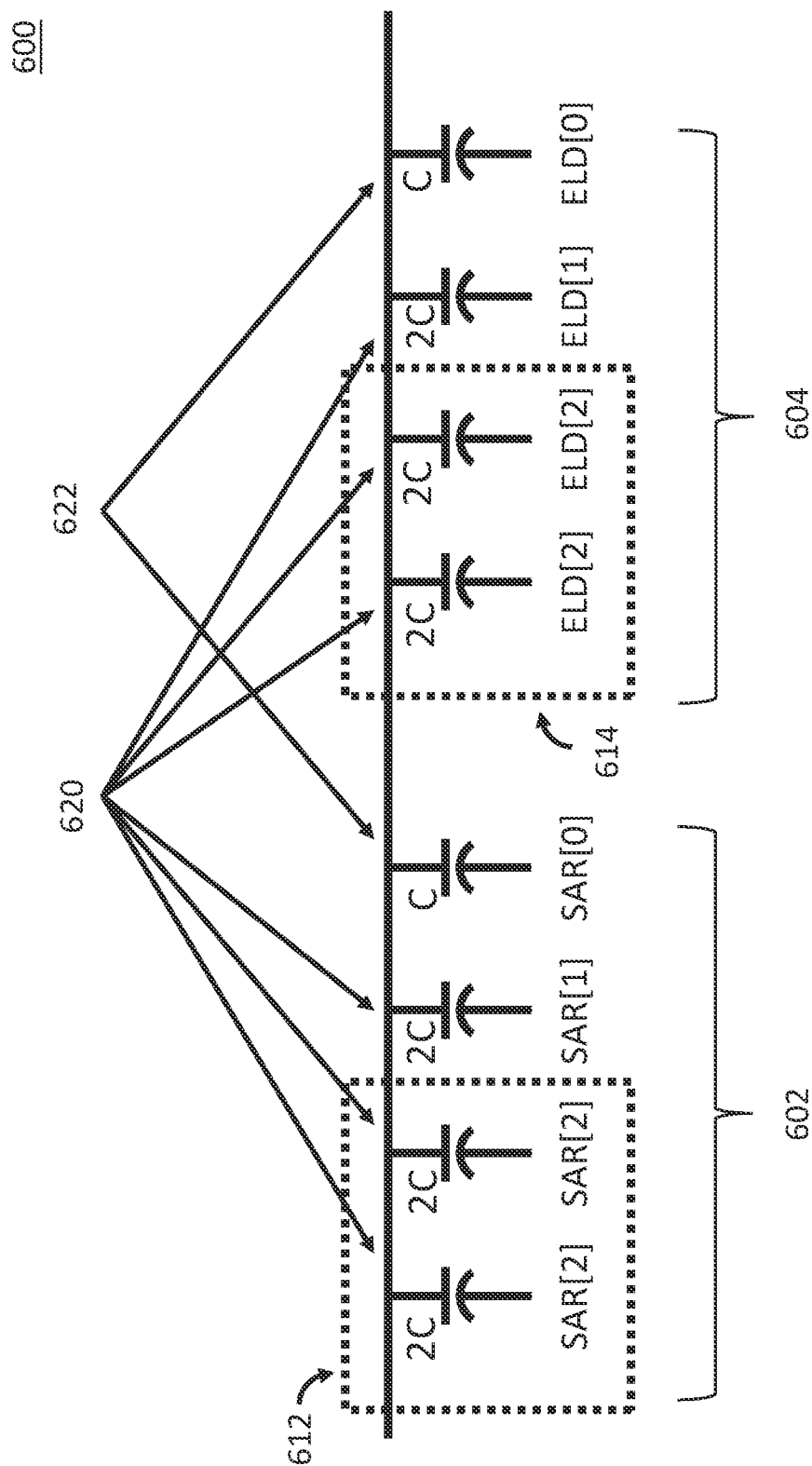
FIG. 6 is a diagram showing two sets of capacitors for gain calibration, according to various embodiments of the disclosure.

FIG. 6 is a diagram 600 showing a set of SAR capacitors 602 and a set of ELD capacitors 604 for gain calibration, according to various embodiments of the disclosure. The SAR capacitors 602 include first and second capacitors having a SAR signal SAR[2], a capacitor having a SAR signal SAR[1] capacitor, and a capacitor having a SAR signal SAR[0]. In some examples, the first and second SAR[2] capacitors are most significant bit (MSB) capacitors or split MSB capacitors. The ELD capacitors 604 includes first and second ELD[2] capacitors, an ELD[1] capacitor, and an ELD[0] capacitor. In some implementations, the SAR capacitors 602 are on a first DAC, and the ELD capacitors 604 are on an ELD DAC. As shown in FIG. 6, the first and second SAR[2] capacitors, and the SAR[1] capacitor are all 2 C capacitors, while the SAR[0] capacitor is a 1 C capacitor. Similarly, the first and second ELD[2] capacitors, and the ELD[1] capacitor are all 2 C capacitors, while the ELD[0] capacitor is a 1 C capacitor. However, in actual implementation, the value of the capacitance on each capacitor can vary. According to various examples, if there is a mismatch in total capacitance between the SAR capacitors 602 and the ELD capacitors 604, the mismatch affects the gain of the SAR and ELD feedbacks.

According to some implementations, the mismatch in the gain between the SAR feedback path and the ELD feedback path can be minimized by swapping equivalent capacitors between the first DAC and the ELD DAC, as described in greater detail with respect to FIG. 7 below. According to various examples, the 2 C capacitors 620 are equivalent. Similarly, the 1 C capacitors 622 are equivalent. Note that for the first and second SAR[2] capacitors 612, the most significant bit (MSB) can be split for swapping. Similarly, the first and second ELD[2] capacitors 614, the most significant bit (MSB) can be split for swapping. In various examples, ELD gain variation is minimized. According to some examples, the various possible combinations of swapping capacitors between the set of SAR capacitors 602 and the set of ELD capacitors 604 are tried, and the setting with the minimum gain error is selected.

Figure 7:
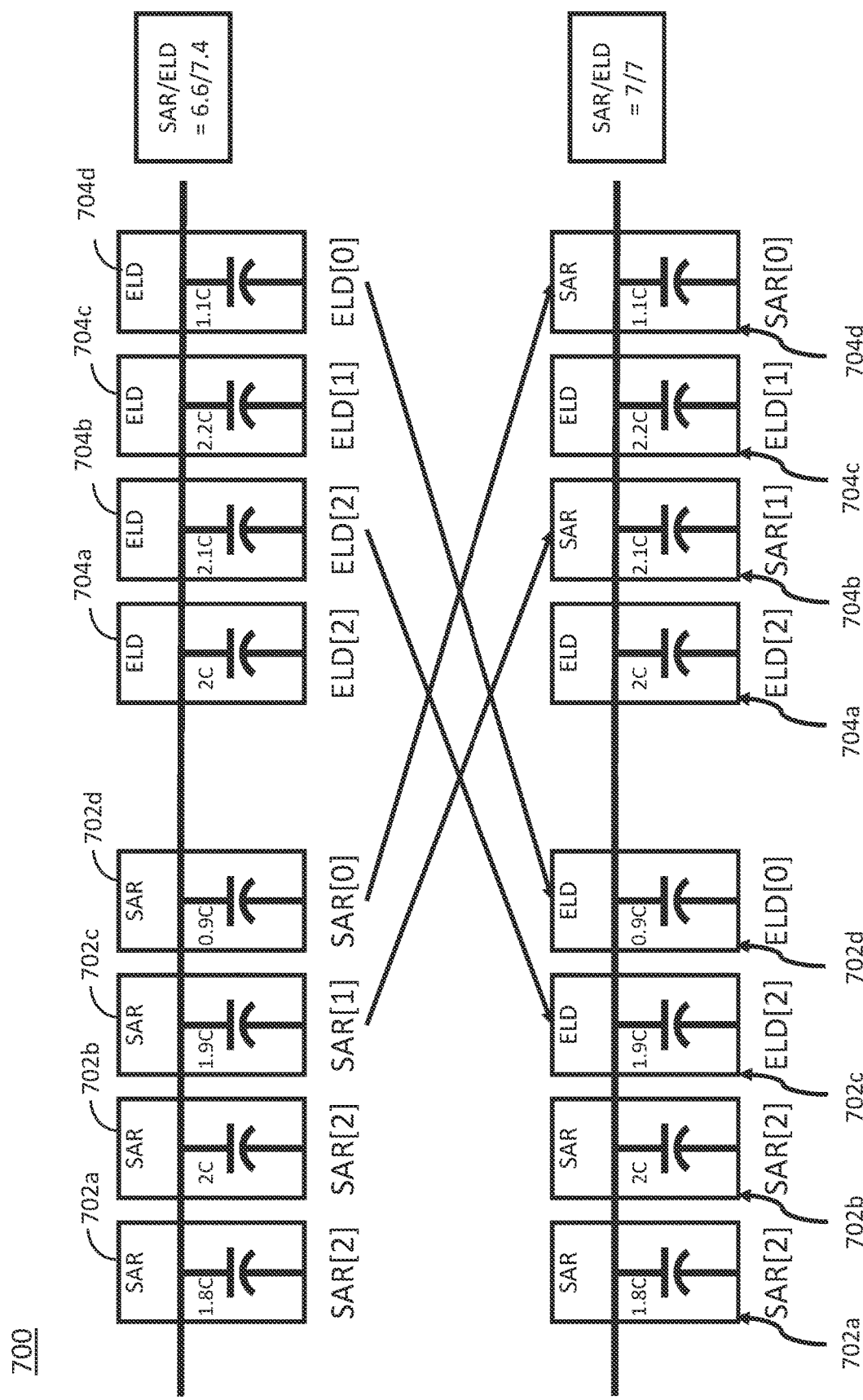
FIG. 7 is a diagram illustrating capacitor swapping for gain calibration, according to various embodiments of the disclosure.

FIG. 7 is a diagram 700 illustrating capacitor swapping for gain calibration, according to various embodiments of the disclosure. The top of the diagram 700 shows first 702a, second 702b, third 702c, and fourth 702d SAR capacitors and first 704a, second 704b, third 704c, and fourth 704d capacitors. While the first 702a, second 702b, and third 702c SAR capacitors and the first 704a, second 704b, and third 704c ELD capacitors are 2 C capacitors, the actual value of each capacitor can vary. In the example shown in FIG. 7, the value of the first SAR capacitor 702a is 1.8 C, the value of the second SAR capacitor 702b is 2 C, and the value of the third SAR capacitor 702c is 1.9 C. Also, in the example shown in FIG. 7, the value of the first ELD capacitor 704a is 2 C, the value of the second ELD capacitor 704b is 2.1 C, and the value of the third ELD capacitor 704c is 2.2 C. Similarly, while the fourth SAR capacitor 702d and the fourth ELD capacitor 704d are 1 C capacitors, the actual values can differ. In the example shown in FIG. 7, the value of the fourth SAR capacitor 702d is 0.9 C and the value of the fourth ELD capacitor 704d is 1.1 C.

Adding up the values of each of the SAR capacitors 702a, 702b, 702c, and 702d, the total SAR capacitance is 6.6. Adding up the values of each of the ELD capacitors, 704a, 704b, 704c, and 704d, the total ELD capacitance is 7.4. The capacitance mismatch between the SAR capacitors and the ELD capacitors causes a gain gap. To minimize the gain gap, the mapping of each of the capacitors can be changed, such that one or more of the SAR capacitors 702a-702d is used as an ELD capacitor, and one or more of the ELD capacitors 704a-704d is used as an SAR capacitor. Although the capacitors each remain in place, the use of each capacitor changes. In the example shown in FIG. 7, the third SAR capacitor 702c is used for the second ELD capacitance, and the fourth SAR capacitor 702d is used for the further ELD capacitance. Thus, the second ELD capacitor 704b is used for the third capacitance, and the fourth ELD capacitor 704*d* is used for the fourth capacitance. By remapping the capacitors used for the SAR capacitance and the capacitors used for the ELD capacitance as shown in FIG. 7, the total SAR capacitance adds up to 7 and the total ELD capacitance adds up to 7, thus minimizing the capacitance variation. In some examples the capacitors are calibrated and constructed at each clock cycle from an overall bank of capacitors In some implementations, one or both of the SAR capacitor set and the ELD capacitor set includes an extra capacitor, as described above, which can be used to compensate for a difference between the SAR capacitance and the ELD capacitance.

Figure 8:
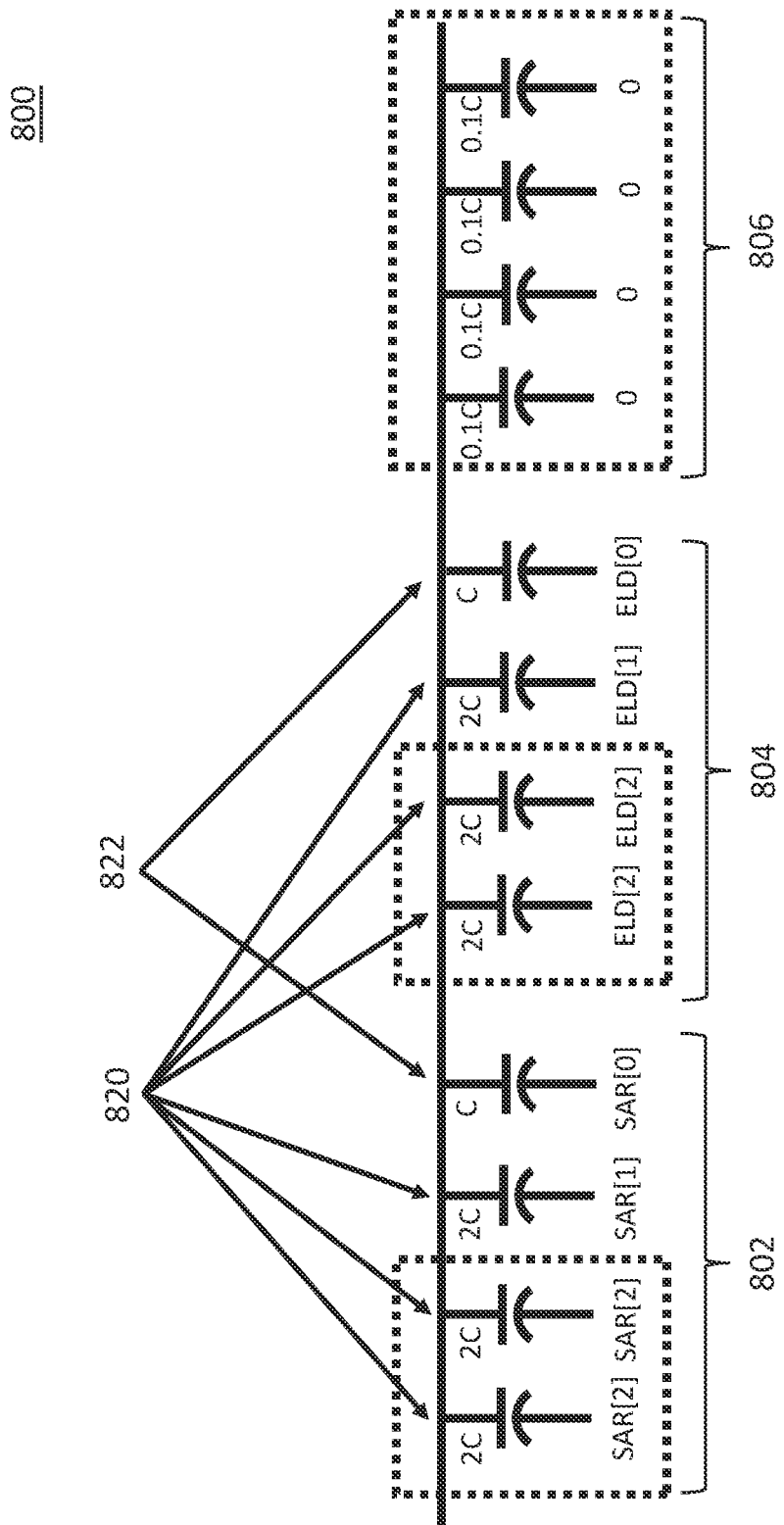
FIG. 8 is a diagram showing capacitors for gain calibration and fine gain tuning, according to various embodiments of the disclosure.

FIG. 8 is a diagram 800 showing a set of SAR capacitors 802 and a set of ELD capacitors 804 for gain calibration and an extra set of capacitors 806 for fine gain tuning, according to various embodiments of the disclosure. The SAR capacitors 802 include first and second SAR[2] capacitors, a SAR[1] capacitor, and a SAR[0] capacitor. The ELD capacitors 804 includes first and second ELD[2] capacitors, an ELD[1] capacitor, and an ELD[0] capacitor. The extra set of capacitors 806 includes four small capacitors. In one example, each of the capacitors of the set 806 is a 0.1 C capacitor. According to various implementations, one or more of the capacitors in the set 806 can be added to the set of SAR capacitors 802 or to the set of ELD capacitors 804 to compensate for a mismatch in capacitance between the set of SAR capacitors 802 and the set of ELD capacitors 804.

According to some examples, the various possible combinations of swapping capacitors between the set of SAR capacitors 802 and the set of ELD capacitors 804 are tried, and the setting with the minimum gain error is selected. According to some examples, a few possible combinations of swapping capacitors between the set of SAR capacitors 802 and the set of ELD capacitors 804 are tried until the error is within a selected range, and then the fine tuning capacitors 806 are used to minimize gain error. According to further examples, gain calibration is completed with the fine tuning capacitors 806 only, and capacitors are not swapped between the set of SAR capacitors 802 and the set of ELD capacitors 804.

Figure 9:
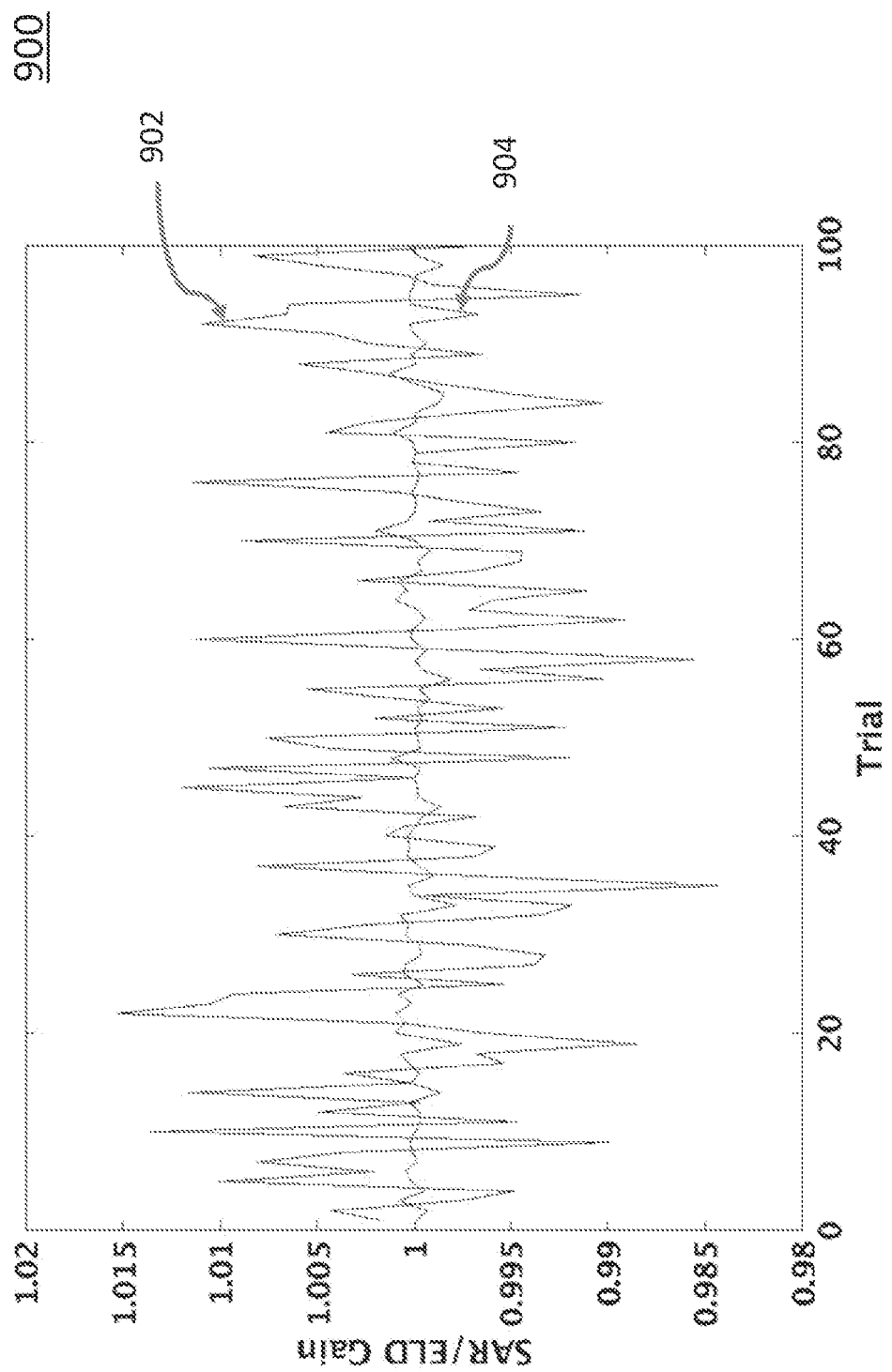
FIG. 9 is a graph showing a gain mismatch before and after calibration, according to various embodiments of the disclosure.

FIG. 9 is a graph 900 showing a SAR/ELD gain mismatch before and after calibration, according to various embodiments of the disclosure. In particular, the graph 900 shows the SAR/ELD gain values over 100 trials. Before calibration, the SAR/ELD values are shown in the line 902. After calibration as described above with respect to FIGS. 6-8, the SAR/ELD gain values decreases significantly, as shown in the line 904.

Figure 10:
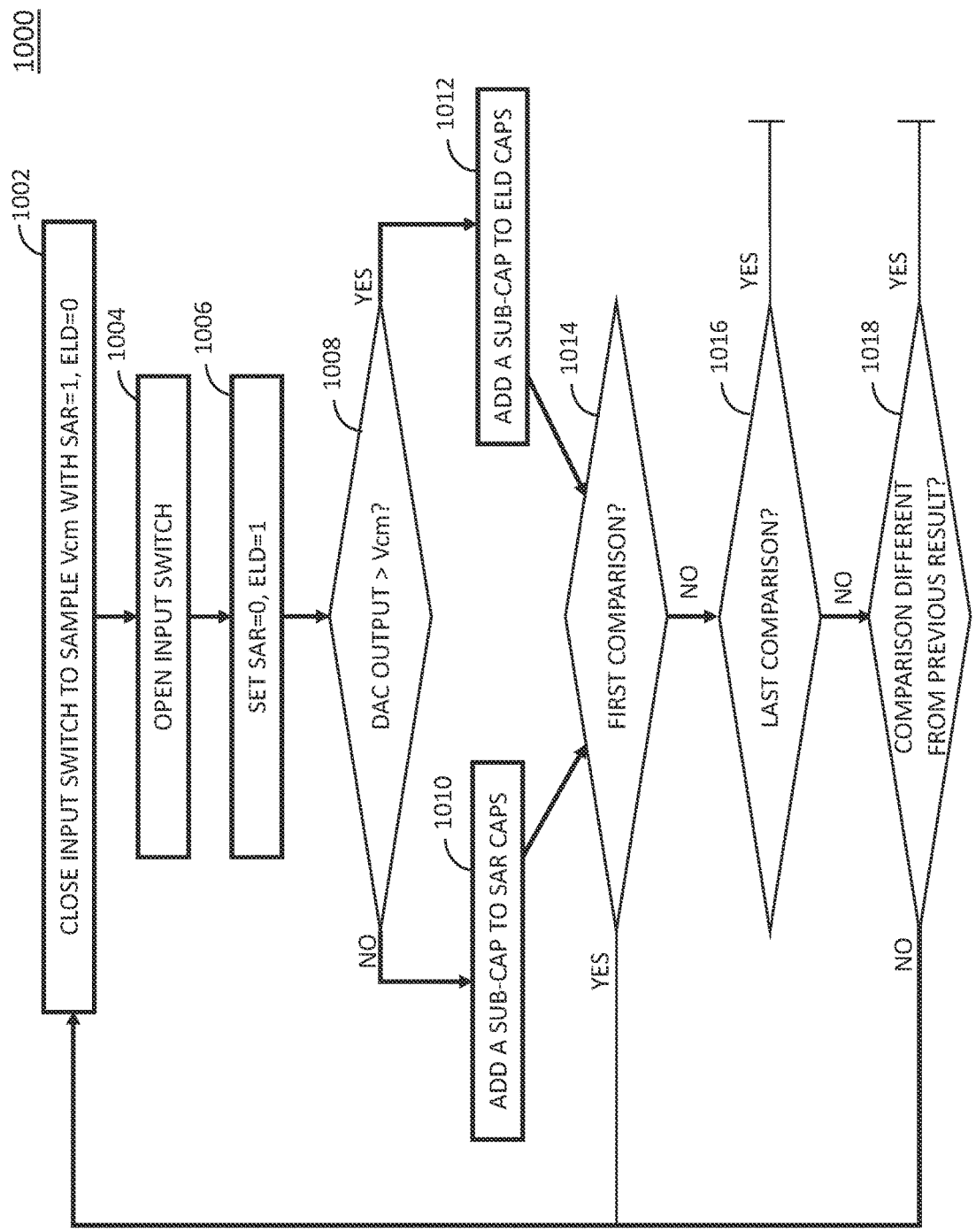
FIG. 10 is a flow chart showing a method for gain calibration using fine tuning capacitors, according to various embodiments of the disclosure.

FIG. 10 is a flow chart showing a method 1000 for gain calibration using fine tuning capacitors, according to various embodiments of the disclosure. The method 1000 includes gain calibration using only the fine tuning capacitors, and not swapping capacitors between a set of SAR capacitors and a set of ELD capacitors. At step 1002, the input switch to the capacitor sets 802, 804, and 806 is closed to sample the common mode voltage ($V_{cm}$) with SAR equal to one and ELD equal to zero. At step 1004, the input switch is opened, and at step 1006, the SAR is set to zero and ELD is set to one. At step 1008, the DAC output is compared to the common mode voltage. If there is a mismatch, the fine tuning capacitors are used to minimize the mismatch. In particular, if the DAC output is greater than the common mode voltage (i.e., if the SAR capacitance is smaller than the ELD capacitance), the method 1000 proceeds to step 1010 and a fine-tuning capacitor (sub-cap) is added to the set of SAR capacitors. At step 1008, if the DAC output is less than the common mode voltage (i.e., if the SAR capacitance is greater than the ELD capacitance), the method 1000 proceeds to step 1012 and a fine-tuning capacitor is added to the set of ELD capacitors.

At step 1014, it is determined whether the comparison at step 1008 was the first comparison. If it was the first comparison, the method returns to step 1002. If it was not the first comparison, the method proceeds to step 1016, where it is determined whether the comparison at step 1008 was the last comparison. If it was the last comparison, the method 1000 ends. If it was not the last comparison, the method 1000 proceeds to step 1018, where it is determined whether the comparison at step 1008 was different from a previous result. If the comparison at step 1008 was different from a previous result, the method 1000 ends. If the comparison at step 1008 was not different from a previous result, the method 1000 returns to step 1002 and repeats.

Figure 11:
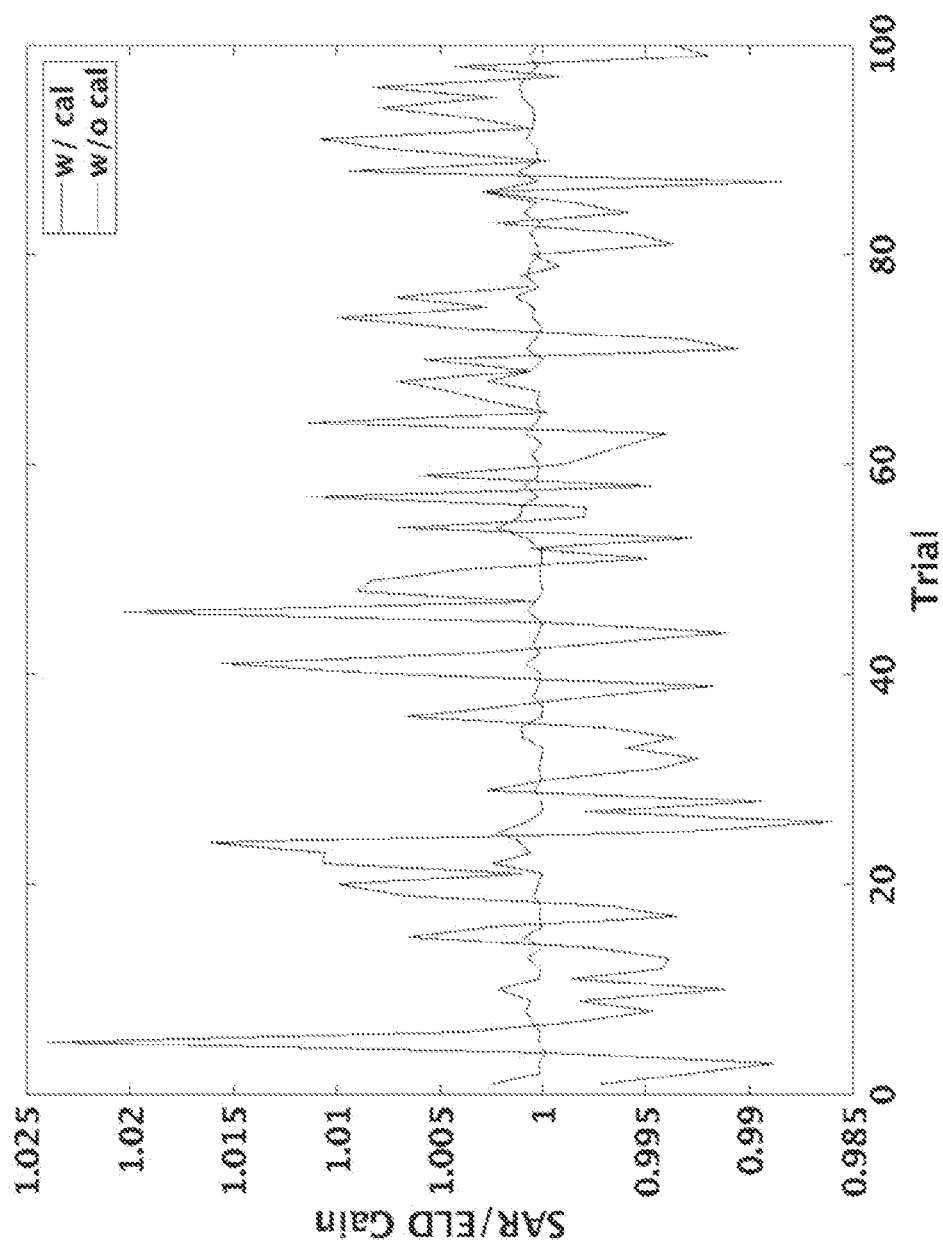
FIG. 11 is a graph showing a gain mismatch before and after calibration using the fine-tuning capacitors, according to various embodiments of the disclosure.

FIG. 11 is a graph 1100 showing a SAR/ELD gain mismatch before and after calibration using the fine-tuning capacitors, according to various embodiments of the disclosure. In particular, the graph 1100 shows the SAR/ELD gain values over 100 trials. Before calibration, the SAR/ELD values are shown in the line 1102. After calibration as described above with respect to FIGS. 8 and 9, the SAR/ELD gain values decreases significantly, as shown in the line 1104.

Figure 12:
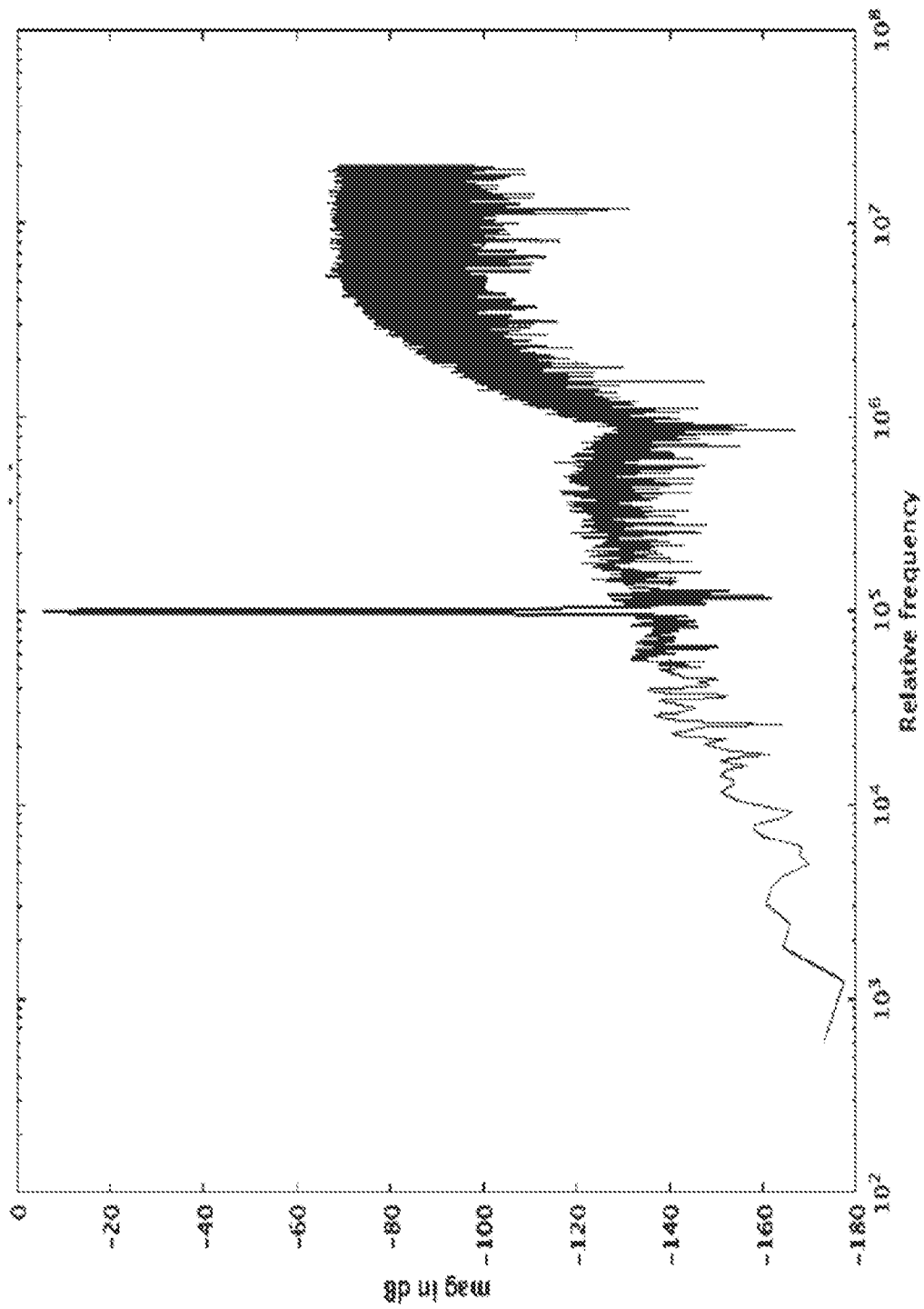
FIG. 12 is a graph showing a Fast Fourier Transform of a delta-sigma ADC using the systems and methods discussed herein, according to various embodiments of the disclosure.

FIG. 12 is a graph 1200 showing a Fast Fourier Transform of a delta-sigma ADC using the systems and methods discussed herein, according to various embodiments of the disclosure.

Figure 13:
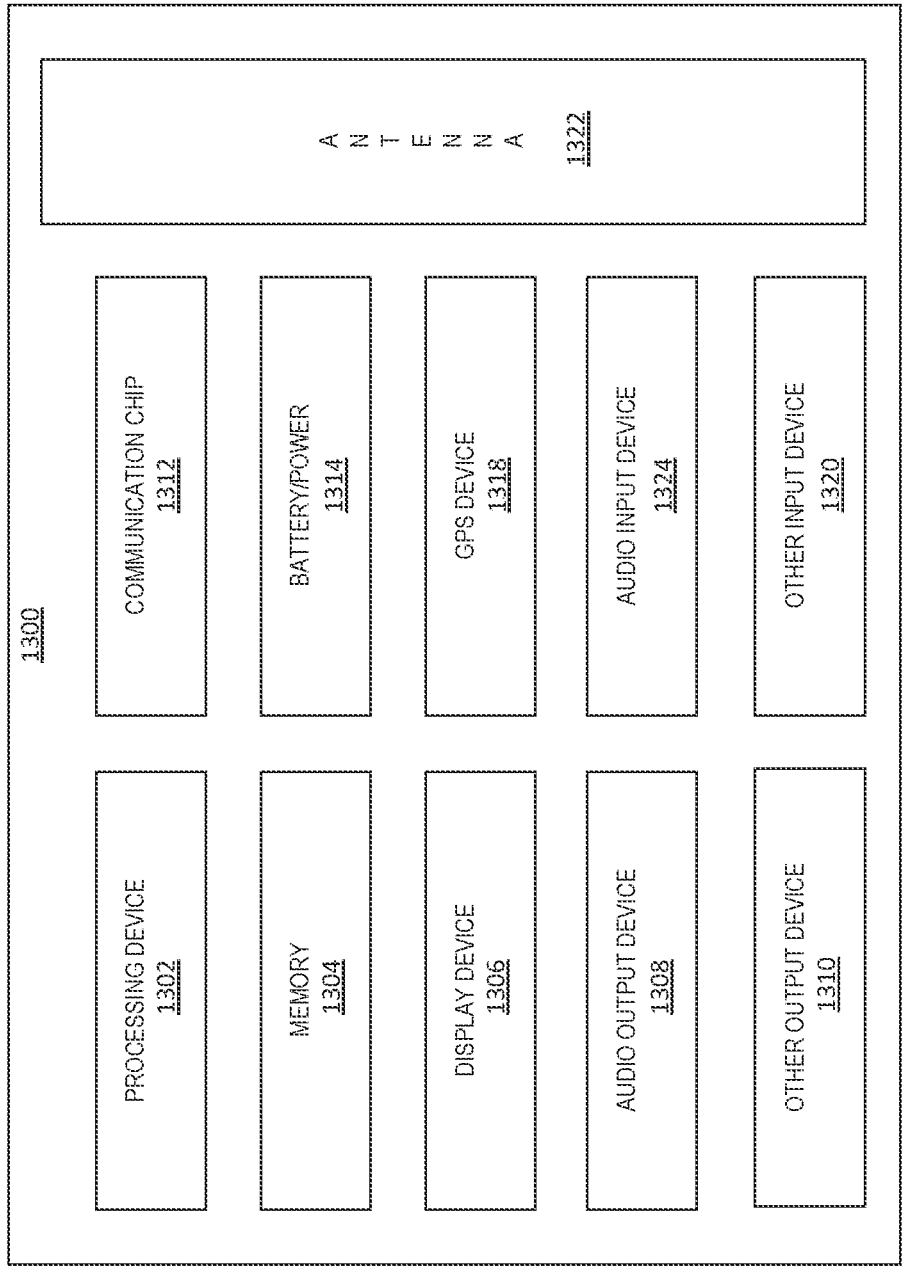
FIG. 13 is a block diagram of an example electrical device that may include one or more delta-sigma ADCs, in accordance with various embodiments of the disclosure.

FIG. 13 is a block diagram of an example electrical device 700 that may include one or more analog-to-digital converters, in accordance with any of the embodiments disclosed herein. A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards. In some embodiments, some or all of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include a processing device 1302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1300 may include a memory 1304, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1304 may include memory that shares a die with the processing device 1302. This memory may be used as cache memory and may include embedded dynamic random access memory (eDRAM) or spin transfer torque magnetic random access memory (STT-MRAM).

In some embodiments, the electrical device 1300 may include a communication chip 1312 (e.g., one or more communication chips). For example, the communication chip 1312 may be configured for managing wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication chip 1312 may manage wired communications, such as electrical, optical, or any other suitable communication protocols (e.g., the Ethernet). As noted above, the communication chip 1312 may include multiple communication chips. For instance, a first communication chip 1312 may be dedicated to shorter-range wireless communications such as Wi-Fi or Bluetooth, and a second communication chip 1312 may be dedicated to longer-range wireless communications such as global positioning system (GPS), EDGE, GPRS, CDMA, WiMAX, LTE, EV-DO, or others. In some embodiments, a first communication chip 1312 may be dedicated to wireless communications, and a second communication chip 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include any visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any device that generates an audible indicator, such as speakers, headsets, or earbuds.

The electrical device 1300 may include an audio input device 1324 (or corresponding interface circuitry, as discussed above). The audio input device 1324 may include any device that generates a signal representative of a sound, such as microphones, microphone arrays, or digital instruments (e.g., instruments having a musical instrument digital interface (MIDI) output).

The electrical device 1300 may include a GPS device 1318 (or corresponding interface circuitry, as discussed above). The GPS device 1318 may be in communication with a satellite-based system and may receive a location of the electrical device 1300, as known in the art.

The electrical device 1300 may include another output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include another input device 1320 (or corresponding interface circuitry, as discussed above). Examples of the other input device 1320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1300 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1300 may be any other electronic device that processes data.

SELECT EXAMPLES

Example 1 provides a method for operation of a delta-sigma analog-to-digital converter, comprising sampling a first input analog signal to a first set of capacitors and a first excess loop delay (ELD) signal to a second set of capacitors, placing a second excess loop delay (ELD) signal on the second set of capacitors to generate a controlled gain ELD signal, subtracting the controlled gain ELD signal from the sampled first input analog signal to generate a delta signal, generating a reference level based on a SAR control signal, comparing the delta signal with the reference level to produce an updated SAR control signal, and generating a SAR output code based on the updated SAR control signal.

Example 2 provides a method according to one or more of the preceding and/or following examples, wherein placing the second ELD signal on the second set of capacitors includes placing an inverted first ELD signal on the second set of capacitors.

Example 3 provides a method according to one or more of the preceding and/or following examples, wherein the first and second ELD signals are ELD feedback signals, and further comprising feeding back the first and second ELD signals on a shared bus.

Example 4 provides a method according to one or more of the preceding and/or following examples, further comprising setting an ELD digital-to-analog converter to a second ELD signal, wherein the second ELD signal is an ELD feedback signal Example 5 provides a method according to one or more of the preceding and/or following examples, wherein the second ELD signal is an inverted version of the first ELD signal.

Example 6 provides a method according to one or more of the preceding and/or following examples, wherein the second ELD signal is equal to the first ELD signal.

Example 7 provides a method according to one or more of the preceding and/or following examples, wherein the first and second ELD signals are equal to a SAR output from the most recent sampling phase plus bit-phase cycle.

Example 8 provides a method according to one or more of the preceding and/or following examples, wherein the first and second ELD signals are each related to a SAR output from the most recent sampling phase plus bit-phase cycle, and the first ELD signal is different from the second ELD signal.

Example 9 provides a method according to one or more of the preceding and/or following examples, wherein the SAR control signal is a SAR feedback signal.

Example 10 provides a method according to one or more of the preceding and/or following examples, wherein generating the SAR output code further includes, during a first phase: repeating, for each of a plurality of bits, generating the reference level, and comparing the delta signal with the reference level to produce the updated SAR control signal; and maintaining the second ELD signal as input to the second set of capacitors.

Example 11 provides a method according to one or more of the preceding and/or following examples, wherein sampling a first input analog signal to a first set of capacitors includes sampling the first input analog signal to one of a top plate of each of the first set of capacitors and a bottom plate of each of the first set of capacitors.

Example 12 provides a method according to one or more of the preceding and/or following examples, wherein sampling and subtracting occur in one of a current domain, a charge domain, and a voltage domain.

Example 13 provides a method according to one or more of the preceding and/or following examples, further comprising sampling the first input analog signal to an additional sampling capacitor.

Example 14 provides a method according to one or more of the preceding and/or following examples, further comprising sampling the first input analog signal to a portion of the first and the second sets of capacitors.

Example 15 provides a method according to one or more of the preceding and/or following examples, further comprising a loop filter configured to provide the first input analog signal.

Example 16 provides a delta-sigma analog-to-digital converter, comprising a sampling switch connected to an input; a first DAC coupled to the sampling switch having a first set of capacitors configured to store a first input signal (SAR) capacitance; a second set of capacitors coupled to the first set of capacitors configured to store an excess loop delay (ELD) signal, wherein the second set of capacitors is configured to generate a controlled gain ELD signal; a comparator and logic circuit configured to receive an output from the first and second sets of capacitors and generate a SAR control signal; and a plurality of feedback lines including an ELD feedback line connecting the logic circuit output with the second set of capacitors.

Example 17 provides an ADC according to one or more of the preceding and/or following examples, further comprising a loop filter configured to provide the input.

Example 18 provides an ADC according to one or more of the preceding and/or following examples, wherein the plurality of feedback lines include a loop filter feedback line connecting the logic circuit output with the loop filter.

Example 19 provides an ADC according to one or more of the preceding and/or following examples, wherein the plurality of feedback lines include a SAR feedback line connecting the logic circuit output with the first set of capacitors Example 20 provides an ADC according to one or more of the preceding and/or following examples, wherein the sampling switch is closed during a sampling phase, connecting the input to the first DAC, and wherein the sampling switch is open during a bit-trial phase, disconnecting the first DAC from the input.

Example 21 provides an ADC according to one or more of the preceding and/or following examples, wherein the second set of capacitors stores a first ELD signal during the sampling phase, wherein the second set of capacitors stores a second ELD signal during the bit-trial phase.

Example 22 provides an ADC according to one or more of the preceding and/or following examples, wherein the second ELD signal is an inverted first ELD signal.

Example 23 provides an ADC according to one or more of the preceding and/or following examples, wherein the first and second ELD signals are related to the SAR control signal from a previous phase.

Example 24 provides an ADC according to one or more of the preceding and/or following examples, wherein sampling and subtracting occur in one of a current domain, a charge domain, and a voltage domain.

Example 25 provides an ADC according to one or more of the preceding and/or following examples, wherein the ELD feedback line is configured for feedback of the ELD signals during the sampling phase and the feedback line is configured for feedback of the second ELD signals during the bit-trial phase.

Example 26 provides an ADC according to one or more of the preceding and/or following examples, wherein a first cycle includes a first sampling phase and a first bit-trial phase, wherein a second cycle includes a second sampling phase and a second bit-trial phase, wherein an ELD gain for the controlled gain ELD signal is a programmable gain, and wherein the ELD gain varies from a first cycle to a second cycle.

Example 27 provides an ADC according to one or more of the preceding and/or following examples, wherein the second set of capacitors is integrated into one of the first DAC and a second DAC.

Example 28 provides an ADC according to one or more of the preceding and/or following examples, wherein each of the first set of capacitors includes a top plate configured to store the SAR capacitance, and wherein each of the first set of capacitors includes a bottom plate configured to store a feedback signal.

Example 29 provides an ADC according to one or more of the preceding and/or following examples, wherein sampling an input to a first set of capacitors and a first excess loop delay (ELD) signal to a second set of capacitors includes sampling analog signals to one of a top plate of each of the set of capacitors and a bottom plate of each of the set of capacitors.

Example 30 provides a delta-sigma analog-to-digital converter, comprising: a sampling switch connected to an input; a first DAC coupled to the sampling switch having a first set of capacitors configured to store a first input signal (SAR) capacitance; a second set of capacitors coupled to the first set of capacitors configured to store an excess loop delay (ELD) signal; a third capacitor coupled to the sampling switch; wherein the sampling switch is closed during a sampling phase, connecting the input to the first DAC, and wherein, during the sampling phase, the input is sampled to at least one of: at least a portion of the first set of capacitors, and the third capacitor.

Example 31 provides an ADC according to one or more of the preceding and/or following examples, wherein at least one of the first set of capacitors, the second set of capacitors, and the third capacitors are configured to be calibrated and constructed at each clock cycle from an overall bank of capacitors.

Example 32 provides a delta-sigma analog-to-digital converter according to one or more of the preceding and/or following examples, wherein each of the first set of capacitors includes a top plate configured to store the SAR capacitance, and wherein each of the first set of capacitors includes a bottom plate configured to store a feedback signal.

Example 33 includes an apparatus that includes an analog-to-digital converter as discussed or depicted in any of the preceding and/or following examples, some other example, or as otherwise discussed or depicted herein.

Example 34 includes an apparatus comprising means to implement an analog-to-digital converter as discussed or depicted in any of the preceding and/or following examples, some other example, or as otherwise discussed or depicted herein.

Example 35 includes a method for implementing or manufacturing an analog-to-digital converter as discussed or depicted in any of the preceding and/or following examples, some other example, or as otherwise discussed or depicted herein.

Example 36 includes one or more non-transitory computer-readable media comprising instructions that, upon execution of the instructions by an electronic device, are to cause the electronic device to implement or manufacture an analog-to-digital converter as discussed or depicted in any of the preceding and/or following examples, some other example, or as otherwise discussed or depicted herein.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

The invention claimed is:

1. A method for operation of a delta-sigma analog-to-digital converter, comprising:
   sampling a first input analog signal to a first set of capacitors and a first excess loop delay (ELD) signal to a second set of capacitors;
   placing a second excess loop delay (ELD) signal on the second set of capacitors to generate a controlled gain ELD signal;
   subtracting the controlled gain ELD signal from the sampled first input analog signal to generate a first delta signal;
   generating a reference level based on a SAR control signal;
   comparing the first delta signal with the reference level to produce an updated SAR control signal; and
   generating a SAR output code based on the updated SAR control signal.

2. The method of claim 1, further comprising a loop filter configured to provide the first input analog signal.

3. The method of claim 1, wherein placing the second ELD signal on the second set of capacitors includes placing an inverted first ELD signal on the second set of capacitors.

4. The method of claim 1, wherein the first and second ELD signals are feedback signals, and further comprising feeding back the first and second ELD signals on a shared bus.

5. The method of claim 1, wherein a first ELD signal value is different from a second ELD signal value, and wherein the first and second ELD signals are a function of previous phase SAR output codes.

6. The method of claim 1, wherein generating the SAR output code further includes, during a first phase:
   repeating, for each of a plurality of bits, generating the reference level, and
   comparing the delta signal with the reference level to produce the updated SAR control signal; and
   maintaining the second ELD signal as input to the second set of capacitors.

7. The method of claim 1, wherein sampling a first input analog signal to a first set of capacitors and a first excess loop delay (ELD) signal to a second set of capacitors includes sampling analog signals to one of a top plate of each of the set of capacitors and a bottom plate of each of the set of capacitors.

8. The method of claim 1, wherein sampling and subtracting occur in one of a current domain, a charge domain, and a voltage domain.

9. The method of claim 1, further comprising sampling the first input analog signal to at least one additional sampling capacitor.

10. The method of claim 9, further comprising sampling the first input analog signal to at least one of: a portion of the first set of capacitors, a portion of the second set of capacitors, and the at least one additional sampling capacitor.

11. A delta-sigma analog-to-digital converter, comprising:
a sampling switch connected to an input;
a first DAC coupled to the sampling switch having a first set of capacitors configured to store a first input signal;
a second set of capacitors coupled to the first set of capacitors configured to store an excess loop delay (ELD) signal, wherein the second set of capacitors is configured to generate a controlled gain ELD signal;
a comparator and logic circuit configured to receive an output from the first and second sets of capacitors and generate a SAR control signal;
a plurality of feedback lines, including an ELD feedback line connecting the logic circuit output with the second sets of capacitors;
wherein the sampling switch is closed during a sampling phase, connecting the input to the first DAC, and the sampling switch is open during a bit-trial phase, disconnecting the first DAC from the input; and
wherein the second set of capacitors stores a first ELD signal during the sampling phase, wherein the second set of capacitors stores a second ELD signal during the bit-trial phase.

12. The delta-sigma analog-to-digital converter of claim 11, further comprising a loop filter configured to provide the input, wherein the plurality of feedback lines include a loop filter feedback line connecting the logic circuit output with the loop filter, and wherein the plurality of feedback lines include a SAR feedback line connecting the logic circuit output with the first set of capacitors.

13. The delta-sigma analog-to-digital converter of claim 11, wherein the second ELD signal is an inverted first ELD signal.

14. The delta-sigma analog-to-digital converter of claim 11, wherein the first and second ELD signals are related to a SAR output signal from previous phases.

15. The delta-sigma analog-to-digital converter of claim 11, wherein sampling and subtracting occur in one of a current domain, a charge domain, and a voltage domain.

16. The delta-sigma analog-to-digital converter of claim 11, wherein a first cycle includes a first sampling phase and a first bit-trial phase, wherein a second cycle includes a second sampling phase and a second bit-trial phase, wherein an ELD gain for the controlled gain ELD signal is a programmable gain, and wherein the ELD gain varies from a first cycle to a second cycle.

17. The delta-sigma analog-to-digital converter of claim 11, wherein sampling an input to the first set of capacitors and the ELD signal to the second set of capacitors includes sampling analog signals to one of a top plate of each of the set of capacitors and a bottom plate of each of the set of capacitors.

18. A delta-sigma analog-to-digital converter, comprising:
a sampling switch connected to an input;
a first DAC coupled to the sampling switch having a first set of capacitors configured to store a first input signal;
a second set of capacitors coupled to the first set of capacitors configured to store an excess loop delay (ELD) signal;
a third capacitor coupled to the sampling switch;
wherein the sampling switch is closed during a sampling phase, connecting the input to the first DAC, and the sampling switch is open during a bit trial phase;
wherein, during the sampling phase, the input is sampled to at least one of:
at least a portion of the first set of capacitors, and
the third capacitor, and
the second set of capacitors stores a first ELD signal;
wherein, during the bit trial phase, the second set of capacitors stores a second ELD signal; and
wherein at least one of the first set of capacitors, the second set of capacitors, and the third capacitors are configured to be calibrated and constructed at each clock cycle from an overall bank of capacitors.

* * * * *